US009716933B2

(12) United States Patent
Oliaei

(10) Patent No.: US 9,716,933 B2
(45) Date of Patent: Jul. 25, 2017

(54) METHOD AND APPARATUS FOR IMPROVING PERFORMANCE OF DIGITAL MICROELECTROMECHANICAL SYSTEMS MICROPHONES

(71) Applicant: INVENSENSE, INC., San Jose, CA (US)

(72) Inventor: Omid Oliaei, Sunnyvale, CA (US)

(73) Assignee: INVENSENSE, INC., San Jose, CA (US)

( * ) Notice: Subject to any disclaimer, the term of this patent is extended or adjusted under 35 U.S.C. 154(b) by 175 days.

(21) Appl. No.: 14/719,507

(22) Filed: May 22, 2015

(65) Prior Publication Data

US 2016/0344358 A1 Nov. 24, 2016

(51) Int. Cl.
*H04R 1/08* (2006.01)
*H03G 3/30* (2006.01)
*H03G 5/16* (2006.01)
*H04R 3/00* (2006.01)
*H04R 19/04* (2006.01)

(52) U.S. Cl.
CPC ............ *H04R 1/08* (2013.01); *H03G 3/3005* (2013.01); *H03G 5/165* (2013.01); *H04R 3/00* (2013.01); *H04R 19/04* (2013.01); *H04R 2201/003* (2013.01)

(58) Field of Classification Search
None
See application file for complete search history.

(56) References Cited

U.S. PATENT DOCUMENTS

| | | | | |
|---|---|---|---|---|
| 8,385,910 | B2* | 2/2013 | Nazrul ............... | H04B 17/0085 455/115.1 |
| 8,625,809 | B2* | 1/2014 | Josefsson ................ | H04R 3/06 381/354 |
| 8,965,736 | B2* | 2/2015 | Horton ............... | G01C 19/5776 702/189 |
| 9,513,122 | B2* | 12/2016 | Rastegar ............ | G01C 19/5776 |
| 2014/0334643 | A1 | 11/2014 | Pinna et al. | |

* cited by examiner

*Primary Examiner* — Paul Huber
(74) *Attorney, Agent, or Firm* — Amin, Turocy & Watson, LLP

(57) ABSTRACT

A microphone device comprising a microelectromechanical systems (MEMS) acoustic sensors, an automatic gain compensation (AGC) component, and a direct current (DC) offset cancellation component is described. An microphone device can be configured for AGC of an analog gain stage or a digital gain stage associated with the MEMS acoustic sensor. Provided implementations can also be configured to compensate DC offset resulting from adjustment of the analog provided by the AGC component. Additional embodiments of the subject disclosure can provide digital frequency equalization and/or linearization.

23 Claims, 12 Drawing Sheets

METHOD AND APPARATUS FOR IMPROVING PERFORMANCE OF DIGITAL MICROELECTROMECHANICAL SYSTEMS MICROPHONES

TECHNICAL FIELD

The subject disclosure relates to microelectromechanical systems (MEMS) sensors and more specifically to signal processing in digital MEMS microphones.

BACKGROUND

Microphones can be exposed to environments where sound levels, described on a log scale using units of decibels of sound pressure level (dBSPL), can range from very quiet (e.g., less than 25 dBSPL) to very loud (e.g., as high as 140 dBSPL). In addition, microphones are typically required to maintain their performance over a large signal range, e.g., up to 140 dB. Simultaneously, microphones are required to exhibit very small intrinsic noise in order to make weak audio signals detectable, while they also need to handle very large audio signals without significant distortion. As a result, such requirements dictate that microphone have a very large dynamic range. However, implementation of high dynamic range microphones using MEMS techniques and complementary metal oxide semiconductor (CMOS) technologies is very challenging, in part, because of the limited available supply voltage, which is typically less than 3.6 volts (V).

It is thus desired to provide high dynamic range MEMS microphones that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, an exemplary microphone device comprising a microelectromechanical systems (MEMS) acoustic sensor, an automatic gain compensation (AGC) component, and a direct current (DC) offset cancellation component is provided, according to aspects of the subject disclosure. An exemplary microphone device can be configured for AGC of an analog gain stage or a digital gain stage associated with the MEMS acoustic sensor. Provided implementations can also be configured to compensate DC offset resulting from adjustment of the analog provided by the AGC component. Additional embodiments of the subject disclosure can provide digital frequency equalization and/or linearization.

Thus, exemplary microphone devices can comprise a MEMS acoustic sensor configured to receive an acoustic signal, an amplifier configured to receive a signal the MEMS acoustic sensor to create an amplified signal, and an analog-to-digital converter (ADC) that converts the amplified signal into a digital signal. In addition, exemplary microphone devices can comprise an AGC component configured for automatic gain control of one or more of an analog gain stage or a digital gain stage associated with the MEMS acoustic sensor. Furthermore, exemplary microphone devices can comprise a DC offset cancellation component configured to compensate for one or more adjustment of the one or more analog gain stage or the digital gain stage determined by the AGC component.

Moreover, exemplary systems, comprising a digital MEMS microphone comprising an AGC component configured for automatic gain control of one or more of an analog gain stage or a digital gain stage associated with the digital MEMS microphone and a DC offset cancellation component configured to compensate for one or more adjustment of the one or more analog gain stage or the digital gain stage determined by the AGC component are described. For instance, exemplary systems can further comprise one or more of a digital frequency equalizer component configured to compensate for distortion in the frequency response of the digital MEMS microphone or a digital linearizer component configured to compensate for non-linearity of at least one of a MEMS transducer associated with the digital MEMS microphone or the analog gain stage. In a further non-limiting aspect, exemplary systems can also comprise a memory configured to store information associated with one or more of the AGC component, frequency equalization, or non-linearity compensation to facilitate operation of the digital MEMS microphone. In another non-limiting aspect, exemplary systems can also comprise an output component configured to transmit a digital signal associated with the digital MEMS microphone comprising one or more of a pulse-density modulation (PDM) signal, integrated interchip sound ($I^2S$) signal, or a Soundwire signal.

In a further non-limiting aspect, exemplary methods associated with MEMS microphones are provided.

These and other embodiments are described in more detail below.

BRIEF DESCRIPTION OF THE DRAWINGS

Various non-limiting embodiments are further described with reference to the accompanying drawings, in which.

DETAILED DESCRIPTION

Overview

Figure 1:
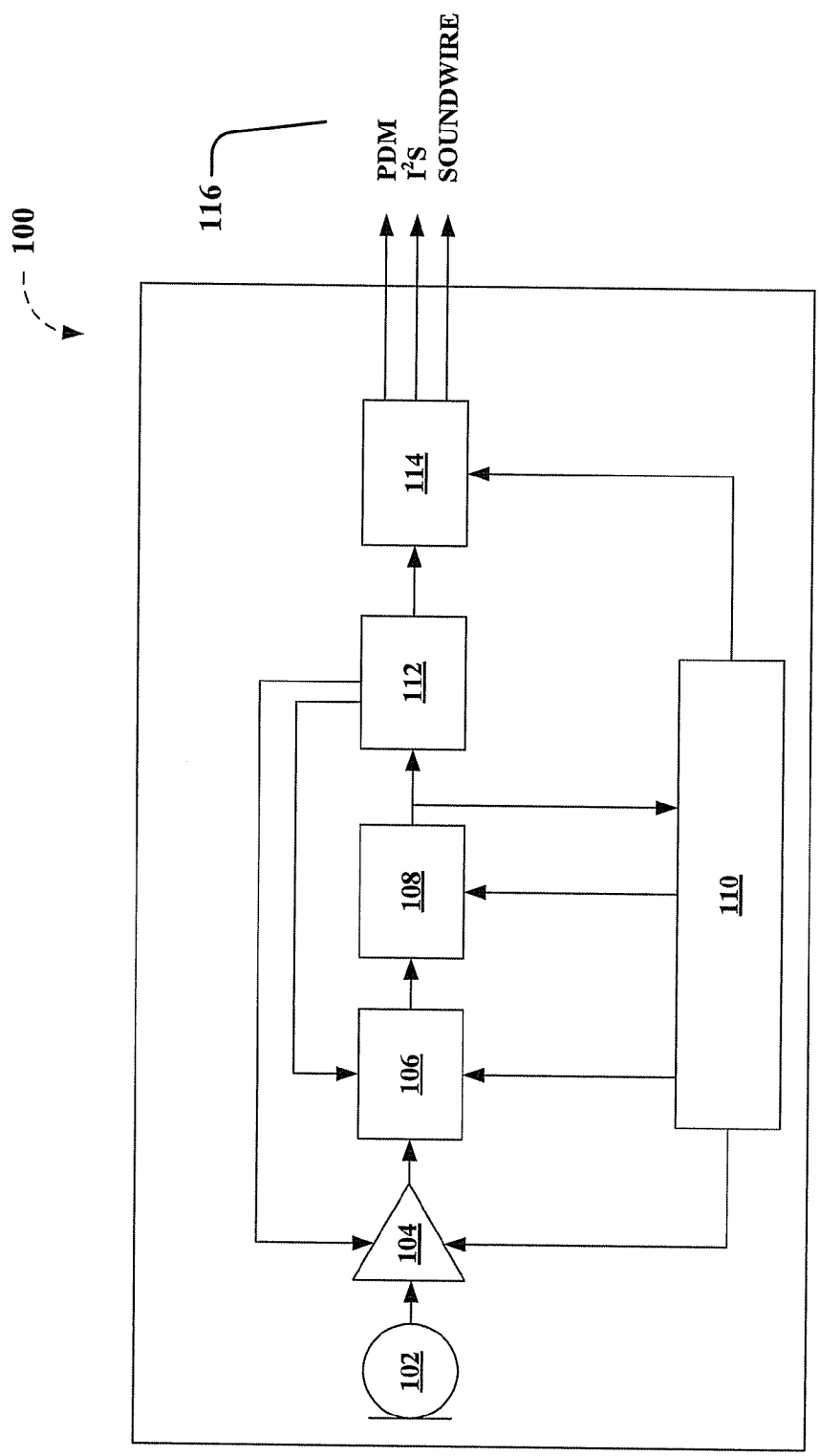
FIG. 1 depicts a functional block diagram of a device comprising an exemplary microelectromechanical systems (MEMS) acoustic sensor, in which a MEMS acoustic sensor can be improved by Automatic Gain Control (AGC) and direct current (DC) offset compensation according to aspects of the subject disclosure.

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein.

According to various described embodiments, the subject disclosure provides digital MEMS microphones using digitally-assisted analog design techniques. In non-limiting aspects, exemplary embodiments can improve the performance of digital MEMS microphones through various digital signal processing and mixed-signal techniques. As described above, implementation of high dynamic range microphones using MEMS techniques and CMOS technologies is very challenging, in part, because of the limited available supply voltage.

In one non-limiting aspect, exemplary MEMS microphones can incorporate Automatic Gain Control (AGC) that can preserve the overall gain of the MEMS microphone system at a constant level for all signal levels, as opposed to conventional AGC approaches employing traditional compression techniques, which do not aim to preserve the overall gain of the system.

In a further non-limiting aspect, exemplary MEMS microphones can incorporate direct current (DC) offset compensation. For instance, it can be understood that applying AGC to audio signals can cause audio artifacts such clicks and pops. For example, imperfections in analog circuitry, such as gain inaccuracy and DC offset, may lead to such artifacts among other things. In various non-limiting embodiments of the subject disclosure, (DC) offset compensation can be employed to ensure the proper operation of the AGC system in a digital microphone to avoid audible artifacts, e.g., artifacts due to AGC, etc.

In yet another non-limiting aspect, digital audio signals associated with exemplary MEMS microphones (e.g., digitized by means of an analog-to-digital converter (ADC)), can employ digital signal processing techniques to facilitate compensation for various types of impairment to the audio signal due to mechanical design of the membrane, due to variations in the associated analog circuitry, etc. In still further non-limiting aspects of the subject disclosure, various exemplary embodiments can facilitate compensation for frequency response and/or non-linearity of digital MEMS microphones, as further described herein.

To these and/or related ends, various aspects of MEMS microphones are described. For example, the various embodiments of the apparatuses, techniques, and methods of the subject disclosure are described in the context of MEMS microphones employing AGC, DC offset compensation, etc. However, as further detailed below, various exemplary implementations can be applied to other areas of MEMS sensor design, without departing from the subject matter described herein.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments. In addition, some depicted digital blocks, steps, or functionalities may be omitted in an actual implementation, and/or the order of the digital blocks, steps, or functionalities may be rearranged.

FIG. 1 depicts a functional block diagram 100 of a device comprising an exemplary microelectromechanical systems (MEMS) acoustic sensor 102, in which a MEMS acoustic sensor 102 can be improved by Automatic Gain Control (AGC) and direct current (DC) offset compensation according to aspects of the subject disclosure. Exemplary MEMS acoustic sensor 102 can be configured to receive an acoustic signal, which can be amplified by an exemplary amplifier 104 configured to receive and amplify a signal from the MEMS acoustic sensor 102 to create an amplified signal. In addition, digital audio signals associated with exemplary MEMS acoustic sensor 102 can be created (e.g., digitized by means of an exemplary ADC 106). In a non-limiting aspect, amplifier 104 can comprise an amplifier having a programmable gain. Thus, exemplary ADC 106 can be configured to convert the amplified signal into a digital signal.

Accordingly, an acoustic signal can be picked up by a transducer (e.g., exemplary MEMS acoustic sensor 102) and converted into an electrical signal. In a loud environment, the amplitude of this electrical signal may be far too large for an active circuit, such as exemplary amplifier 104, to process it without detrimental effects, such as distortion. Thus, in other non-limiting aspects, an exemplary passive attenuator (not shown) having a variable gain can be inserted between exemplary amplifier 104 and exemplary MEMS acoustic sensor 102, as described below regarding FIG. 3.

Digital audio signals associated with exemplary MEMS acoustic sensor 102 can be controlled by exemplary gain compensation component 108 based in part on an exemplary AGC controller configured for automatic gain control of one or more of the analog gain stage components (e.g., one or more of exemplary amplifier 104, exemplary ADC 106, and/or an exemplary passive attenuator (not shown), etc.) and/or the digital gain stage (e.g., exemplary gain compensation component 108, etc.) associated with exemplary MEMS acoustic sensor 102. For example, AGC component 110 can determine the appropriate gain any of the system components (e.g., exemplary amplifier 104, exemplary ADC 106, and/or an exemplary passive attenuator (not shown), exemplary gain compensation component 108, etc.) by monitoring the amplitude of the digital signal generated by exemplary ADC 106. To this end, output of the ADC 106 can be filtered using a decimation filter (not shown), after digital gain compensation provided by exemplary gain compensation component 108, and provided to the AGC component 110 to facilitate maintaining a constant overall gain at all signal levels associated with exemplary MEMS acoustic sensor 102 while protecting the analog stage components (e.g., exemplary amplifier 104, exemplary ADC 106, and/or an exemplary passive attenuator (not shown), etc.) from saturation due to large signals.

In an embodiment, AGC component 110 can be configured to monitor signal amplitude generated by ADC 106 and reduce gain of one or more of the analog stage components analog stage components (e.g., one or more of exemplary amplifier 104, exemplary ADC 106, and/or an exemplary passive attenuator (not shown), etc.) when the signal amplitude crosses predetermined thresholds. In addition, the AGC component 110 can be configured to apply a compensating amount of digital gain (e.g., via gain compensation component 108, etc.), to maintain a constant overall system gain. Thus, in a non-limiting aspect, large signals requiring more analog attenuation (e.g., via adjustment of gain of one or more of exemplary amplifier 104, exemplary ADC 106, and/or an exemplary passive attenuator (not shown), etc.) can be compensated by larger digital gain (e.g., via gain compensation component 108, etc.), whereas smaller signals requiring less analog attenuation (e.g., via adjustment of gain of one or more of exemplary amplifier 104, exemplary ADC 106, and/or an exemplary passive attenuator (not shown), etc.) can be compensated by less digital gain (e.g., via gain compensation component 108, etc.).

As described above, DC offset generated by one or more analog stage components (e.g., one or more of exemplary amplifier 104, exemplary ADC 106, and/or an exemplary passive attenuator (not shown), etc.) is detrimental to an audio system employing AGC, due to the audible artifacts that it can generate. In particular, DC offset may result in annoying audible pops which are created as an AGC controller changes the gain of the various components of the system. Accordingly, in various non-limiting embodiments, the subject disclosure provides exemplary DC offset compensation/cancellation component 112 that can be configured to compensate for one or more adjustment of one or more of the analog gain stage or the digital gain stage determined by exemplary AGC component 110. That is, exemplary DC offset compensation/cancellation component 112 can be configured to compensate for DC offset generated by one or more analog stage components (e.g., one or more of exemplary amplifier 104, exemplary ADC 106, and/or an exemplary passive attenuator (not shown), etc.). In a non-limiting aspect, DC offset compensation can be performed in the analog domain, in the digital domain, or in both analog and digital domains. In a further non-limiting aspect, an exemplary AGC (e.g., AGC component 110) can determine the appropriate gain for any of the analog and digital components (e.g., exemplary amplifier 104, exemplary ADC 106, an exemplary passive attenuator (not shown), exemplary gain compensation component 108, etc.) to perform appropriate DC offset compensation at each stage where AGC is employed. Accordingly, in another non-limiting aspect, an amount of DC offset generated by one or more of the analog stage components can be computed by an exemplary DC offset computation component (not shown) and stored in a non-volatile memory (not shown) and/or volatile memory (not shown) unit for later use, for example, as further described below regarding FIG. 3.

In a further non-limiting aspect, exemplary embodiments of the subject disclosure can comprise an output component 114 configured to transmit a digital signal associated with exemplary MEMS acoustic sensor 102 (e.g., a digital signal associated with exemplary DC offset compensation/cancellation component 112) comprising one or more signal 116, comprising one or more of a pulse-density modulation (PDM) signal, integrated interchip sound ($I^2S$) signal, or a Soundwire signal. Thus, in a non-limiting aspect, output component 114 can be configured to convert the digital signal associated with exemplary DC offset compensation/cancellation component 112 into an appropriate format for transmission. As a non-limiting example, output component 114 can be configured to convert the digital signal into one or more of an $I^2S$ or SoundWire signal. In still another non-limiting aspect, exemplary DC offset compensation/cancellation component 112 can comprise an exemplary digital sigma-delta modulator (not shown) configured to generate a PDM output signal, for example, as further described below regarding FIG. 3.

Figure 2:
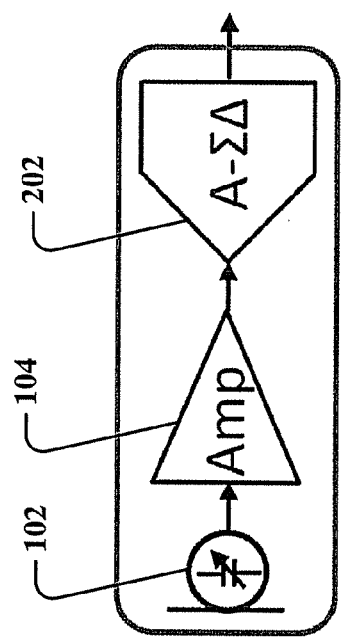
FIG. 2 depicts another functional block diagram of an exemplary MEMS acoustic sensor suitable for incorporation of aspects of the subject disclosure.

FIG. 2 depicts another functional block diagram 200 of an exemplary MEMS acoustic sensor 102 suitable for incorporation of aspects of the subject disclosure. As a non-limiting example, exemplary MEMS acoustic sensor 102 can be configured to convert an acoustic signal to an electrical signal, which can be amplified by an exemplary amplifier 104 configured to receive and amplify a signal from the MEMS acoustic sensor 102 to create an amplified signal. In a non-limiting aspect, amplifier 104 can comprise an amplifier having a programmable gain. As described above regarding FIG. 1, digital audio signals associated with exemplary MEMS acoustic sensor 102 can be created (e.g., digitized by means of an exemplary ADC 106). ADC 106 can comprise an exemplary analog sigma-delta modulator 202 configured to convert the amplified signal into a digital signal, for example, as further described below regarding FIG. 3. Thus, exemplary analog sigma-delta modulator 202 can be configured to convert the amplified signal into a digital signal. It can be understood that exemplary MEMS acoustic sensor 102, exemplary amplifier 304, ADC 106 comprising an exemplary analog sigma-delta modulator 202, or otherwise, as well as other components, circuitry, and/or functionality, as described herein, can reside on one or more dice, inside a single package. As further described below regarding FIG. 3, exemplary analog sigma-delta modulator 202 can be configured to receive a clock signal from an outside clock signal via a frequency multiplier (not shown) to enable further suppression of quantization noise generated by exemplary analog sigma-delta modulator 202.

Figure 3:
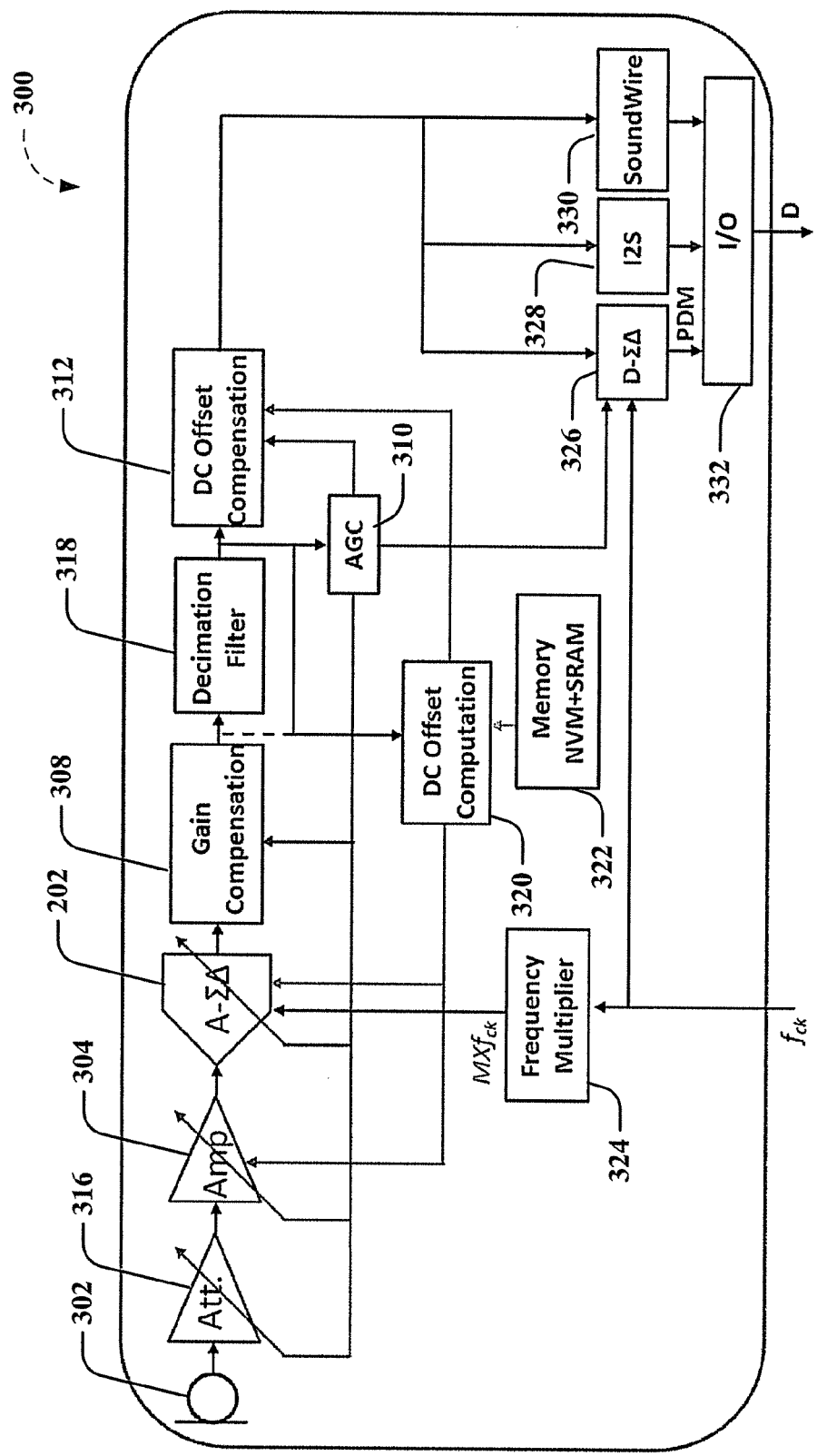
FIG. 3 depicts a functional block diagram of an exemplary digital microphone device according to further non-limiting aspects of the subject disclosure.

FIG. 3 depicts a functional block diagram of an exemplary digital microphone device 400 according to further non-limiting aspects of the subject disclosure. As described above, regarding FIG. 1, the exemplary digital microphone device 400 can comprise an exemplary MEMS acoustic sensor 302 configured to receive an acoustic signal, an exemplary amplifier 304 configured to receive a signal from the MEMS acoustic sensor 302 and to create an amplified signal, and/or ADC 106 (e.g., exemplary analog sigma-delta modulator 202) configured to convert the amplified signal into a digital signal. In a non-limiting aspect, amplifier 304 can comprise an amplifier having a programmable gain.

Accordingly, an acoustic signal can be picked up by a transducer (e.g., exemplary MEMS acoustic sensor 302) and converted into an electrical signal. In a loud environment, the amplitude of this electrical signal may be far too large for an active circuit, such as exemplary amplifier 304, to process it without detrimental effects, such as distortion. Thus, in other non-limiting aspects, an exemplary passive attenuator 316 having a variable gain can be inserted between exemplary amplifier 304 and exemplary MEMS acoustic sensor 302.

Digital audio signals associated with exemplary MEMS acoustic sensor 302 can be controlled by exemplary gain compensation component 308 based in part on an exemplary AGC controller configured for automatic gain control of one or more of the analog gain stage (e.g., exemplary amplifier 304, exemplary ADC 106, and passive attenuator 316, etc.) and/or the digital gain stage (e.g., exemplary gain compensation component 308, etc.) associated with exemplary MEMS acoustic sensor 302. For example, AGC component 310 can determine the appropriate gain for each block (e.g., exemplary amplifier 304, exemplary ADC 106, passive attenuator 316, exemplary gain compensation component 308, etc.) by monitoring the amplitude of the digital signal generated by exemplary ADC 106. To this end, output of the ADC 306 can be filtered using a decimation filter 318, after digital gain compensation provided by exemplary gain compensation component 308, and provided to the AGC component 310 to facilitate maintaining a constant overall gain at all signal levels associated with exemplary MEMS acoustic sensor 302 while protecting the analog stage components (e.g., exemplary amplifier 304, exemplary ADC 106, and passive attenuator 316, etc.) from saturation due to large signals.

In an embodiment, AGC component 310 can be configured to monitor the signal amplitude generated by ADC 106 and reduce the gain of one or more of the analog stage components analog stage components (e.g., one or more of exemplary amplifier 304, exemplary ADC 106, and passive attenuator 316, etc.) when the signal amplitude crosses certain thresholds. In addition, AGC component 310 can be configured to apply an equal amount of digital gain (e.g., via gain compensation component 308, etc.), to maintain a constant overall system gain. Thus, in a non-limiting aspect, large signals requiring more analog attenuation (e.g., via adjustment of gain of one or more of exemplary amplifier 304, exemplary ADC 106, and/or exemplary passive attenuator 316, etc.) can be compensated by larger digital gain (e.g., via gain compensation component 308, etc.), whereas smaller signals requiring less analog attenuation (e.g., via adjustment of gain of one or more of exemplary amplifier 304, exemplary ADC 106, and/or an exemplary passive attenuator 316, etc.) can be compensated by less digital gain (e.g., via gain compensation component 308, etc.).

In addition, in an exemplary digital microphone device 400, as described above regarding FIG. 2, the output of the amplifier 304 can be coupled to an ADC (e.g., ADC 106, etc.), which can comprise an exemplary analog sigma-delta modulator (e.g., exemplary analog sigma-delta modulator 202), to produce a digital output signal. In a non-limiting aspect, exemplary analog sigma-delta modulator 202 can receive a clock signal (MX $f_{ck}$) generated from an outside clock signal ($f_{ck}$) using a frequency multiplier 324 to enable further suppression of quantization noise generated by exemplary analog sigma-delta modulator 202. For purposes of illustration, exemplary gain compensation component 308 based in part on an exemplary AGC controller can be configured for automatic gain control of digital signals resulting from one or more of the analog gain stage components (e.g., one or more of exemplary amplifier 304, exemplary ADC 106 comprising exemplary analog sigma-delta modulator 202, and exemplary passive attenuator 316, etc.) in the system whose overall gain can be adjusted using an exemplary digital AGC engine (e.g., the AGC component 310 and/or exemplary gain compensation component 308, etc.). For example, AGC component 310 can determine the appropriate gain any of the system components (e.g., exemplary amplifier 304, exemplary ADC 106 comprising exemplary analog sigma-delta modulator 202, passive attenuator 316, exemplary gain compensation component 308, etc.) by monitoring the amplitude of the digital signal generated by exemplary analog sigma-delta modulator 202. To this end, output of exemplary analog sigma-delta modulator 202 can be filtered using an exemplary decimation filter 318, after digital gain compensation provided by exemplary gain compensation component 308, and provided to the AGC component 310 to facilitate maintaining a constant overall gain at all signal levels associated with exemplary MEMS acoustic sensor 302 while protecting the analog stage components (e.g., exemplary amplifier 304, exemplary ADC 106 comprising exemplary analog sigma-delta modulator 202, passive attenuator 316, etc.) from saturation due to large signals.

Thus, in a non-limiting example, AGC component 310 can be configured to monitor signal amplitude generated by exemplary analog sigma-delta modulator 202 and can be configured to reduce the gain of any of the analog stage components (e.g., exemplary amplifier 304, exemplary ADC 106 comprising exemplary analog sigma-delta modulator 202, passive attenuator 316, etc.), for example, when signal amplitude crosses predetermined thresholds. In addition, exemplary AGC component 310 can be configured to apply a compensating amount of digital gain (e.g., via exemplary gain compensation component 308, etc.), to maintain a constant overall system gain. Thus, in a non-limiting aspect, large signals requiring more analog attenuation (e.g., via adjustment of gain of one or more of exemplary amplifier 304, exemplary analog sigma-delta modulator 202, and passive attenuator 316, etc.) can be compensated by larger digital gain (e.g., via gain compensation component 308, etc.), whereas smaller signals requiring less analog attenuation (e.g., via adjustment of gain of one or more of exemplary amplifier 104, exemplary analog sigma-delta modulator 202, and passive attenuator 316, etc.) can be compensated by less digital gain (e.g., via gain compensation component 308, etc.). While for purposes of illustration, exemplary gain compensation component 308 is depicted, relative to a loop comprising exemplary analog sigma-delta modulator 202 and a signal monitoring path associated with exemplary AGC component 310, the subject disclosure is not so limited. For example. In a non-limiting aspect, exemplary gain compensation component 308 can be employed outside of the loop comprising exemplary analog sigma-delta modulator 202 and a signal monitoring path associated with exemplary AGC component 310 (e.g., exemplary gain compensation component 308 placed after exemplary decimation filter 318 and after the signal monitoring path associated with exemplary AGC component 310).

As described above, DC offset generated by one or more analog stage components (e.g., one or more of exemplary amplifier 304, exemplary ADC 106, and passive attenuator 316, etc.) is detrimental to an audio system employing AGC, due to the audible artifacts that it can generate. Accordingly, in various non-limiting embodiments, the subject disclosure provides exemplary DC offset compensation/cancellation component 312 that can be configured to compensate for one or more adjustment of one or more of the analog gain stage or the digital gain stage determined by exemplary AGC component 310. That is, exemplary DC offset compensation/cancellation component 312 can be configured to compensate for DC offset generated by one or more analog stage components (e.g., one or more of exemplary amplifier 304, exemplary ADC 106 comprising exemplary analog sigma-delta modulator 202, and passive attenuator 316, etc.). In a non-limiting aspect, DC offset compensation can be performed in the analog domain, in the digital domain, or in both analog and digital domains. In a further non-limiting aspect, an exemplary AGC (e.g., AGC component 310) can determine the appropriate gain for any of the analog and digital components (e.g., exemplary amplifier 304, exemplary ADC 106 comprising exemplary analog sigma-delta modulator 202, passive attenuator 316, exemplary gain compensation component 308, etc.) to perform appropriate DC offset compensation at each stage where AGC is employed. Accordingly, in another non-limiting aspect, an amount of DC offset generated by the analog components can be computed by an exemplary DC Offset Computation component 320 and stored in a non-volatile memory and/or volatile memory 322 (e.g., Memory NVM+SRAM 322) unit for later use.

In a further non-limiting aspect, exemplary embodiments of the subject disclosure can comprise an output component (e.g., comprising one or more of digital sigma-delta modulator 326, circuitry for I²S signal generation 328, circuitry for SoundWire signal generation 330, and/or Input/Output (I/O) component 332, etc.) configured to transmit a digital signal (D) associated with exemplary MEMS acoustic sensor 302 (e.g., a digital signal associated with exemplary DC offset compensation/cancellation component 312) comprising one or more signal D comprising one or more of a PDM signal, an I²S signal, or a Soundwire signal. Thus, in a non-limiting aspect, an exemplary output component can be configured to convert the digital signal associated with exemplary DC offset compensation/cancellation component 312 into an appropriate format for transmission. As a non-limiting example, an exemplary output component can be configured to convert the digital signal into one or more of an I²S or SoundWire signal. In still another non-limiting aspect, exemplary DC offset compensation/cancellation component 112 can comprise exemplary digital sigma-delta modulator 326, fed by an interpolation filter (not shown), and configured to generate a PDM output signal. In a further non-limiting aspect, exemplary digital sigma-delta modulator 326 can be configured to receive information about the amount of AGC applied in exemplary digital microphone device 300 in order to adjust its characteristics, such as order of the digital sigma-delta modulator 326.

Figure 4:
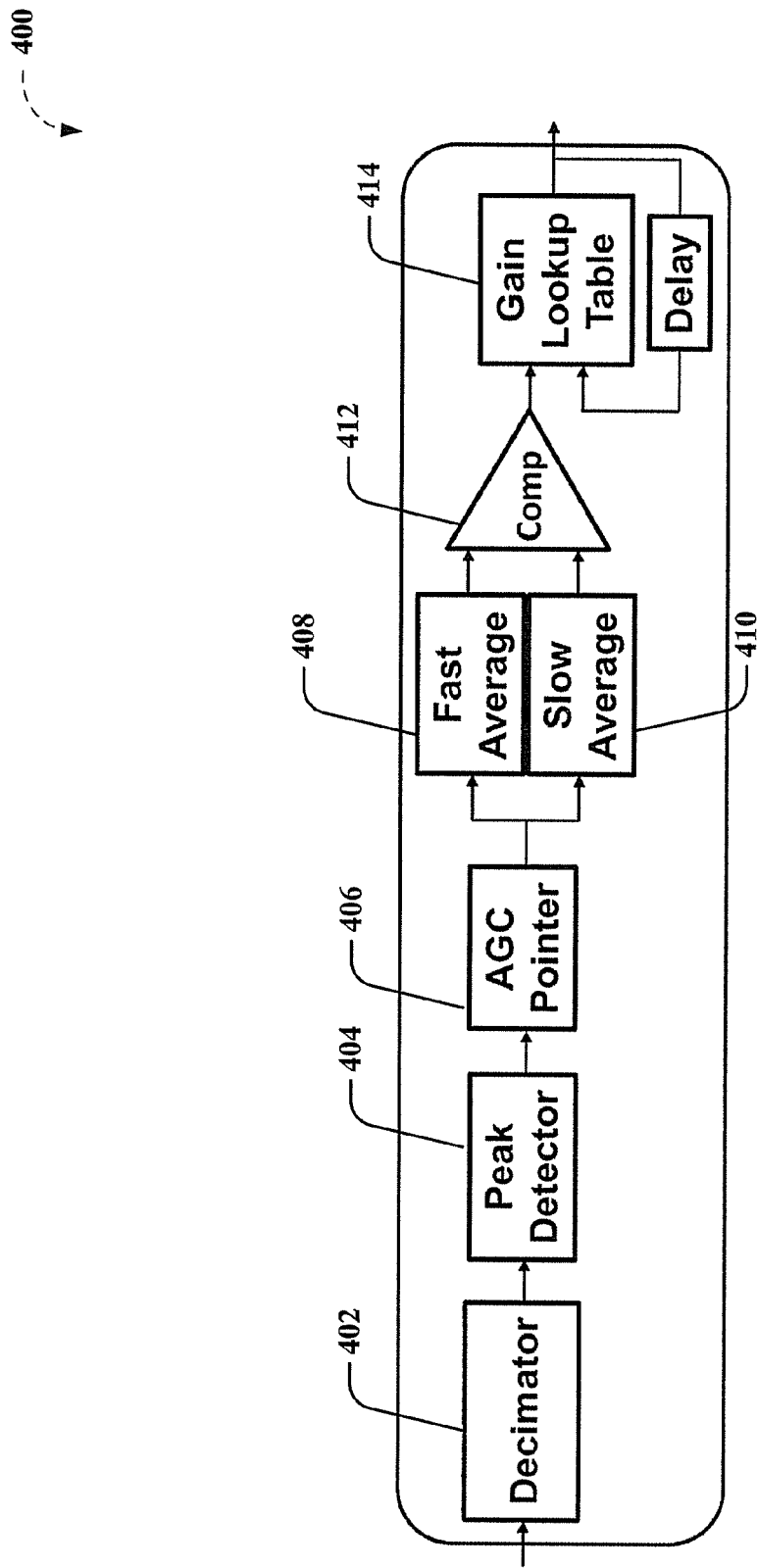
FIG. 4 depicts another functional block diagram illustrating non-limiting aspects associated with an exemplary AGC component configured for automatic gain control according to further non-limiting aspects of the subject disclosure.

FIG. 4 depicts another functional block diagram illustrating non-limiting aspects associated with an exemplary AGC component 400 (e.g., AGC component 110, AGC component 310, etc.) configured for automatic gain control according to further non-limiting aspects of the subject disclosure. For example, in a non-limiting aspect, exemplary AGC component 400 can be configured to receive ADC output (e.g., output from ADC 106, output from ADC 106, comprising exemplary analog sigma-delta modulator 202, etc.), which can be filtered (e.g., via exemplary decimation filter 318, etc.) and decimated (e.g., via exemplary decimator 402, etc.) to a lower rate. In a further non-limiting aspect, exemplary AGC component 400 can comprise an exemplary peak detector 404 configured to determine the peak of the signal from the exemplary decimator 402 during a predetermined time. In yet another non-limiting aspect, exemplary peak detector 404 can be configured to determine the peak of the signal from the exemplary decimator 402 during a predetermined time longer than 50 milliseconds (ms). Thus, exemplary AGC component 400 comprising peak detector 402 can be configured to determine a certain amount of gain associated with a detected signal peak, in further non-limiting aspects.

According to various non-limiting embodiments, the subject disclosure facilitates changing or adjusting one or more of analog and/or digital gains according to an exemplary algorithm that determines the attack and decay rates. As a non-limiting example, in non-limiting embodiments, exemplary AGC component 400 can facilitate changing or adjusting one or more of analog and/or digital gains where the attack rate is larger than the decay rate. For instance, exemplary AGC component 400 can be configured to apply AGC on a relatively fast pace as signal amplitude increases to ensure that large signal swings do not cause clipping of the signal, whereas AGC is reduced at a relatively slower pace as the signal subsides in order to make sure that a resurgence of large amplitudes does not cause clipping. Accordingly, an exemplary EGC component 400 can comprise circuitry for generating fast moving averages 408 and circuitry for generating slow moving averages 410 for the AGC Pointer 406, and can comprise comparator 412 and gain lookup table 414, to facilitate determining an amount of AGC to apply employing a gain lookup table 414 based at least in part on a comparison (e.g., via comparator 412) between generated fast moving average and slow moving average of the AGC Pointer 406.

Figure 5:
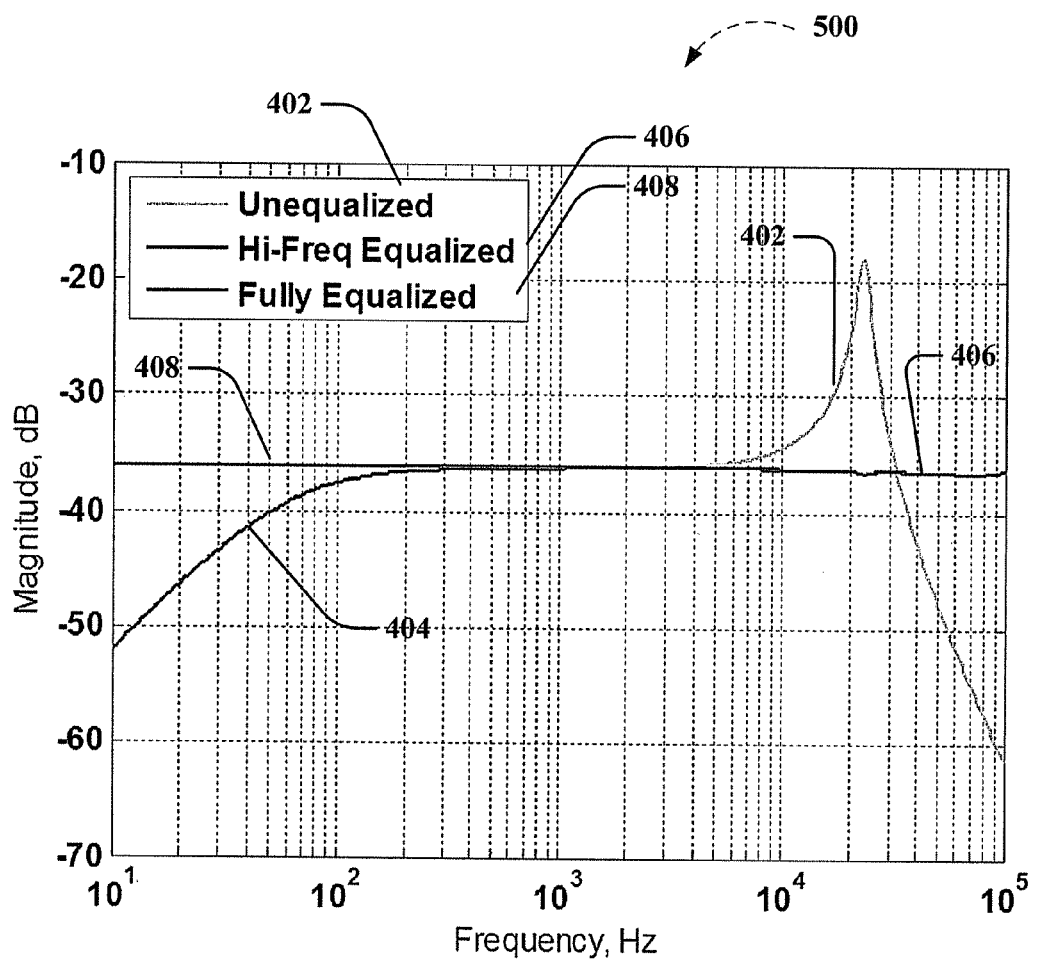
FIG. 5 demonstrates frequency response of a conventional microphone and the effect of frequency equalization in accordance with further non-limiting aspects of the subject disclosure.

FIG. 5 demonstrates frequency response of a conventional microphone and the effect of frequency equalization in accordance with further non-limiting aspects of the subject disclosure. As further described below regarding FIG. 6, after gain adjustment (e.g., via, exemplary gain compensation component 108/308) and DC offset compensation (e.g., via exemplary component DC offset compensation/cancellation component 112/312, etc.), a digitized acoustic signal may undergo further processing to compensate for various types of impairment caused by the mechanical structure of system components and/or one or more of the analog stage components. As a non-limiting example, such impairment can be caused by distortion in the frequency response of the transducer (e.g., exemplary MEMS acoustic sensor 102/302, etc.). For instance, mechanical design of a MEMS acoustic membrane usually causes its frequency response to exhibit a large peak 402 at high frequencies (e.g., in the vicinity of about 20 kilohertz (kHz). This large peaking can increase overall system noise, and thus, this native frequency response can reduce the signal-to-noise ratio of associated microphone systems. In a further non-limiting example, magnitude 404 of the frequency response can also be reduced at low frequencies. Thus, in various non-limiting aspects, the subject disclosure provides signal processing techniques that can be employed to adjust the frequency response of microphone systems employing exemplary MEMS acoustic sensor 102/302, etc. For instance, FIG. 5 depicts a high-frequency equalized signal 406 having high-frequency peak removed and a fully equalized signal 408, wherein the entire frequency response has been flattened. Thus, in further non-limiting aspects, embodiments of the subject disclosure can employ frequency response equalization to facilitate reshaping the magnitude frequency response of the microphone devices and systems employing exemplary MEMS acoustic sensor 102/302, etc., as further described herein, regarding FIG. 6. In other non-limiting aspects, phase or group-delay response can also be adjusted using frequency equalization in practical applications sensitive to phase or group-delay, but may be impractical in applications directed toward human audibility.

In addition, another type of impairment that can be encountered in microphone devices and systems employing exemplary MEMS acoustic sensor 102/302, etc., is signal distortion due to the non-linearity of the MEMS acoustic membrane and/or non-linearity of one or more analog stage components. As further described below regarding FIG. 6, the subject disclosure provides signal processing techniques that can be employed to compensate for these types of distortions.

Figure 6:
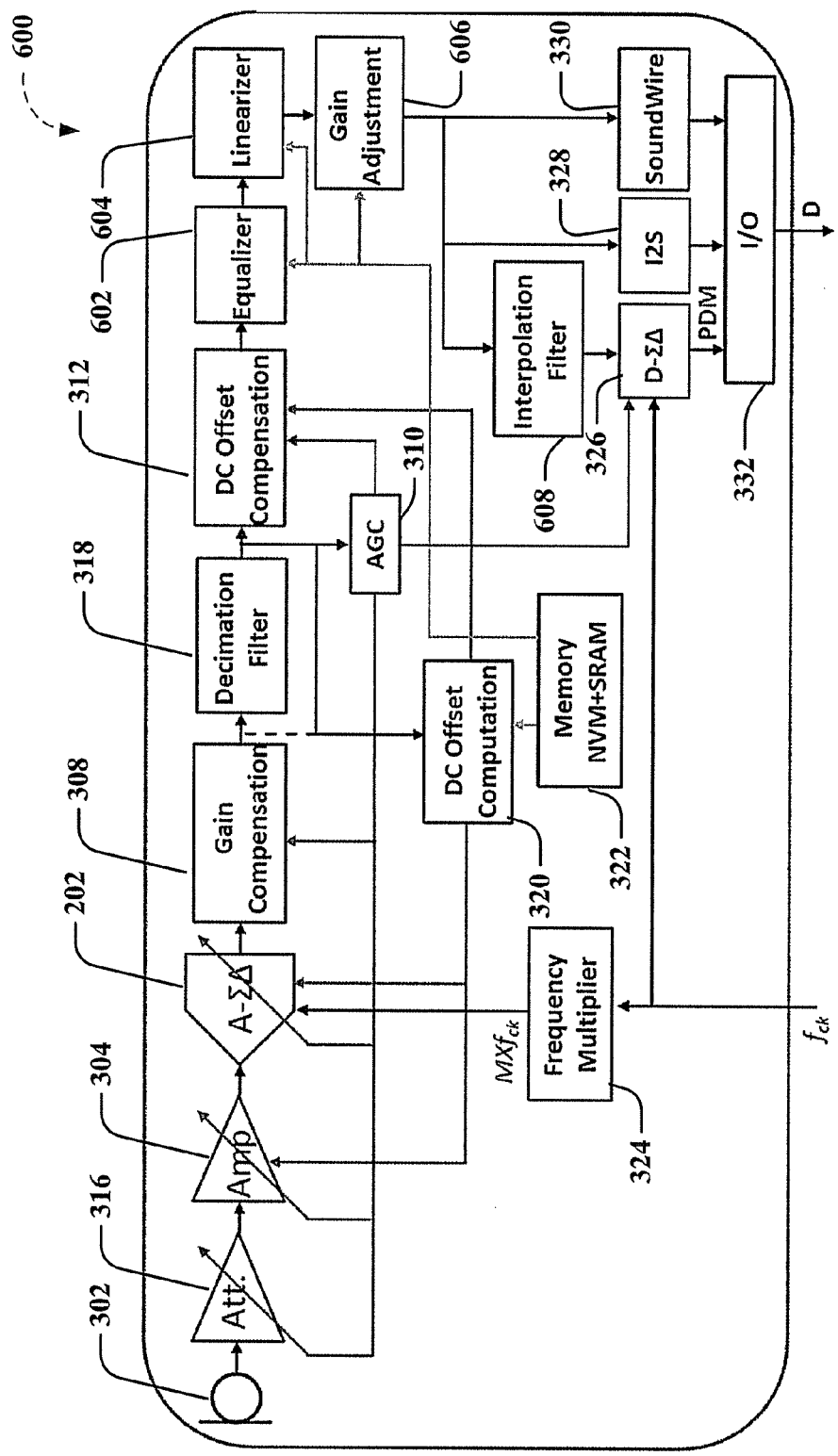
FIG. 6 depicts another functional block diagram of an exemplary digital microphone device that can incorporate one or more of an exemplary digital frequency equalizer component or an exemplary digital linearizer according to further non-limiting aspects of the subject disclosure.

FIG. 6 depicts another functional block diagram of an exemplary digital microphone device 600 that can incorporate one or more of an exemplary digital frequency equalizer component 602 and/or an exemplary digital linearizer component 604 according to further non-limiting aspects of the subject disclosure. For purposes of illustration, exemplary digital microphone device 600, components, subcomponents, and/or portions are combinations thereof, can be described as above regarding exemplary digital microphone device 300 in FIG. 3. In addition, in various non-limiting aspects, the subject disclosure provides signal processing techniques that can be employed to adjust the frequency response of microphone systems employing exemplary MEMS acoustic sensor 102/302, etc. For instance, as depicted in FIG. 6, exemplary digital microphone device 600 can comprise an exemplary digital frequency equalizer component 602 configured to receive the digital signal associated with exemplary DC offset compensation/cancellation component 312 and perform frequency equalization as described herein, for example, regarding FIG. 5. Thus, in further non-limiting aspects, embodiments of the subject disclosure can employ frequency response equalization to facilitate reshaping the magnitude frequency response of the microphone devices and systems employing exemplary MEMS acoustic sensor 102/302, etc. In other non-limiting aspects, phase or group-delay response can also be adjusted using frequency equalization in practical applications sensitive to phase or group-delay.

As described above, another type of impairment that can be encountered in microphone devices and systems employing exemplary MEMS acoustic sensor 102/302, etc., is signal distortion due to the non-linearity of the MEMS acoustic membrane and/or non-linearity of one or more analog stage components. Accordingly, in various non-limiting aspects, the subject disclosure provides signal processing techniques that can be employed to compensate for these types of distortions due to nonlinearities in associated systems. Thus, exemplary digital microphone device 600 can comprise an exemplary digital linearizer component 604 that can be configured to compensate for signal distortion due to nonlinearities in the system, and can be configured to apply digital non-linearity to the digitized signal such that the non-linear terms eventually cancel out.

In a further non-limiting aspect, exemplary digital microphone device 600 can further comprise an exemplary digital gain adjustment component 606 that can facilitate gain adjustment at the output of the exemplary digital linearizer component 604. As further described below regarding FIGS. 10-11, information that facilitates frequency equalization, non-linearity compensation, and/or gain adjustment can be obtained using specific tests and stored in a non-volatile memory and/or volatile memory 322 (e.g., Memory NVM+SRAM 322) unit for later use. In yet another non-limiting aspect, various non-limiting embodiments can employ a predetermined signal threshold, below which, to disable AGC, for example, at signal levels that can be acceptably processed by the one or more analog stage components. It can be understood that, to achieve best noise performance, as the signal level crosses the predetermined signal threshold, AGC can be employed as described herein. In another non-limiting aspect, as the signal level crosses the predetermined signal threshold and AGC is employed, the amount of AGC can be phased in a gradual introduction (e.g., increased first using small AGC steps, then in larger AGC steps, etc.).

In a further non-limiting aspect, various non-limiting embodiments can apply AGC as described herein, selectively, in a predetermined order of components of the one or more analog stage components. In a non-limiting example, various non-limiting embodiments can apply AGC first by adjusting the gain of the ADC 106, then, by adjusting the gain of the amplifier 104/304, and then by adjusting the passive attenuator 316. It can be understood that, by applying AGC, selectively, in a predetermined order of components of the one or more analog stage components, signal-to-noise ratio can be optimized for given environmental conditions.

As further described above, regarding FIG. 3, exemplary digital sigma-delta modulator 326 can be configured to receive information about the amount of AGC applied in exemplary digital microphone device 300 in order to adjust its characteristics, such as order of exemplary digital sigma-delta modulator 326. Accordingly, in various non-limiting embodiments, characteristics of exemplary digital sigma-delta modulator 326, fed by an interpolation filter 608, for generating a PDM output, may dynamically be adjusted as the amount of AGC changes. For example, the order of exemplary digital sigma-delta modulator 326 can be reduced when the input signal amplitude becomes large, which can risk exemplary digital sigma-delta modulator 326 becoming unstable. As a further non-limiting example, order of exemplary digital sigma-delta modulator 326 can be increased in the event that the signal amplitude goes down, such that non-limiting embodiments of the subject disclosure are still able to provide high signal-to-noise ratio.

Various embodiments are described above, wherein AGC component 110/310 can be configured to apply a compensating amount of digital gain (e.g., via gain compensation component 108/308, etc.), to maintain a constant overall system gain. In yet another non-limiting aspect, various embodiments of the subject disclosure can provide varying the amount of digital amplification (e.g., via gain compensation component 108/308, etc.) other than a compensating amount of digital gain, such that the digital amplification, in terms of magnitude, can be different than the amount of analog attenuation determined and/or applied. As a non-limiting example, exemplary implementations can apply less digital gain at very high signal levels to ensure the stability of a digital sigma-delta modulator. For instance, this can be appropriate when the signal level is extremely high and a drop in the overall gain, equivalent to signal compression, is not perceptible by the human ear.

As described above, exemplary digital microphone device 300/600 can comprise exemplary analog sigma-delta modulator 202 that can be configured to receive a clock signal (MX $f_{ck}$) generated from an outside clock signal ($f_{ck}$) using a frequency multiplier 324 to enable further suppression of quantization noise generated by the sigma-delta modulator 202. In another non-limiting aspect, various non-limiting embodiments can enable AGC for certain modes of operation, for example, set by the outside clock signal ($f_{ck}$). As an illustrative example, exemplary digital microphone device 300/600 can be configured to receive outside clock signal ($f_{ck}$) from another component such as a Coder-Decoder (CODEC). In a non-limiting aspect, various embodiments of exemplary digital microphone device 300/600 can be configured to enter into a low-power mode when the clock frequency is below a first clock frequency threshold, below 1 megahertz (MHz), as a non-limiting example. In a non-limiting aspect, various embodiments of exemplary digital microphone device 300/600 can be configured to enter into a normal operation mode when the clock frequency is between the 1st clock frequency threshold and a second clock frequency threshold, for example, between 1 MHz and 2 MHz, as further non-limiting examples. In yet another non-limiting aspect, various embodiments of exemplary digital microphone device 300/600 can be configured to enter into high-performance mode when the clock frequency is between a third clock frequency threshold and a fourth clock frequency threshold (e.g., between 3 MHz and 4 MHz).

According to this non-limiting aspect, various embodiments of exemplary digital microphone device 300/600 can selectively provide high dynamic range only in the high performance mode, for example, where power usage and performance requirements are commensurate, thereby conserving power when such performance requirements are not present. Thus, in particular non-limiting aspects, various embodiments of exemplary digital microphone device 300/600 can employ AGC only if the clock frequency is between the third clock frequency threshold and the fourth clock frequency threshold (e.g., between 3 MHz and 4 MHz) and when the exemplary digital microphone device 300/600 is operating in the high-performance mode.

In other non-limiting aspects, various embodiments of exemplary digital microphone device 300/600 can employ AGC, wherein adjustment of the analog gain stage and/or the digital gain stage is configured to be applied below audible range for humans. As a non-limiting example, various embodiments of exemplary digital microphone device 300/600 can employ AGC, wherein update rate (e.g., rate at which AGC settings that affect the analog and/or digital gain stages are updated) of the AGC is selected such that AGC settings are updated at a rate below the audible range for humans (e.g., about 20 Hz). Alternatively, various embodiments of exemplary digital microphone device 300/600 can update AGC settings in time intervals exceeding 50 ms to avoid folding of noise from high frequencies into the audible range. In addition, in various non-limiting embodiments described herein, DC offset compensation/cancellation can be synched with AGC gain adjustments and/or non-synched. Nevertheless, according to further non-limiting aspects, DC offset compensation/cancellation can be performed in response to the AGC adjustments and the resulting effects on the one or more analog stage components. According to another non-limiting aspect both DC offset compensation/cancellation and AGC adjustments can be performed at a rate below the audible range for humans (e.g., about 20 Hz).

As described above, avoiding audible artifacts (e.g., artifacts caused by mismatch between analog and digital gains, etc.) is central to successful systems employing AGC. Mismatch between analog and digital gains can transform a DC offset into audible pops and clicks and can cause a perception of varying loudness or fading. Although digital gains can generally be implemented accurately, analog gains may not be as accurate. Accordingly, in a further non-limiting aspect, various embodiments of exemplary digital microphone device 300/600 can employ gain values selected to be rational numbers, preferably of the form $k/2^N$, where k and N are integers. Exemplary implementations employing such gain values can facilitate simplifying digital implementation of the digital gains and can facilitate providing more accurate analog gains, because unit elements, such as unit resistors or unit capacitors, can be used to generate the various analog gain values.

Figure 7:
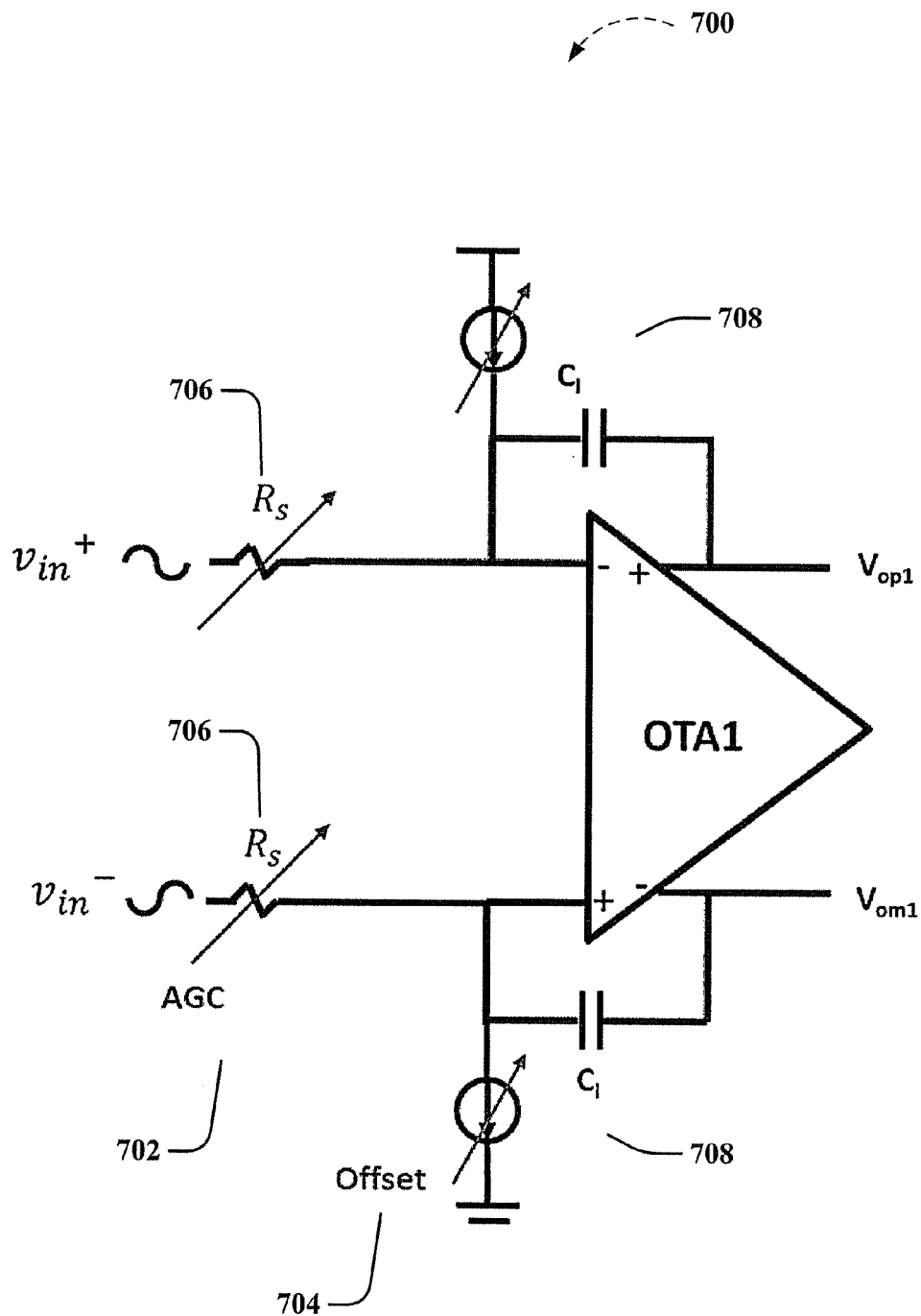
FIG. 7 depicts a schematic for an input stage of an exemplary continuous-time sigma-delta modulator with adjustable gain and offset cancellation suitable for use in various non-limiting embodiments of the subject disclosure.

As a non-limiting example, FIG. 7 depicts a schematic for an input stage of an exemplary continuous-time sigma-delta modulator 700 with adjustable gain 702 and offset cancellation 704 suitable for use in various non-limiting embodiments of the subject disclosure. For instance, exemplary continuous-time sigma-delta modulator 700 with adjustable gain 702 and offset cancellation 704 can facilitate adjusting gain of exemplary continuous-time sigma-delta modulator 700 using segmented input resistors 706. In a non-limiting implementation, each input resistor 706 can be sub-divided into, for example, eight unit resistors thus, providing rational gain numbers of 1/8, 2/8, . . . , 1. In yet another non-limiting aspect, DC offset of the one or more analog stage components can be compensated using analog techniques. In the exemplary embodiment of FIG. 7, programmable current sources, or current-mode digital-to-analog converter (DAC), 708 can be employed to compensate for DC offset at the input of the ADC 106 (e.g., ADC 106 comprising exemplary continuous-time sigma-delta modulator 700, etc.).

Figure 8:
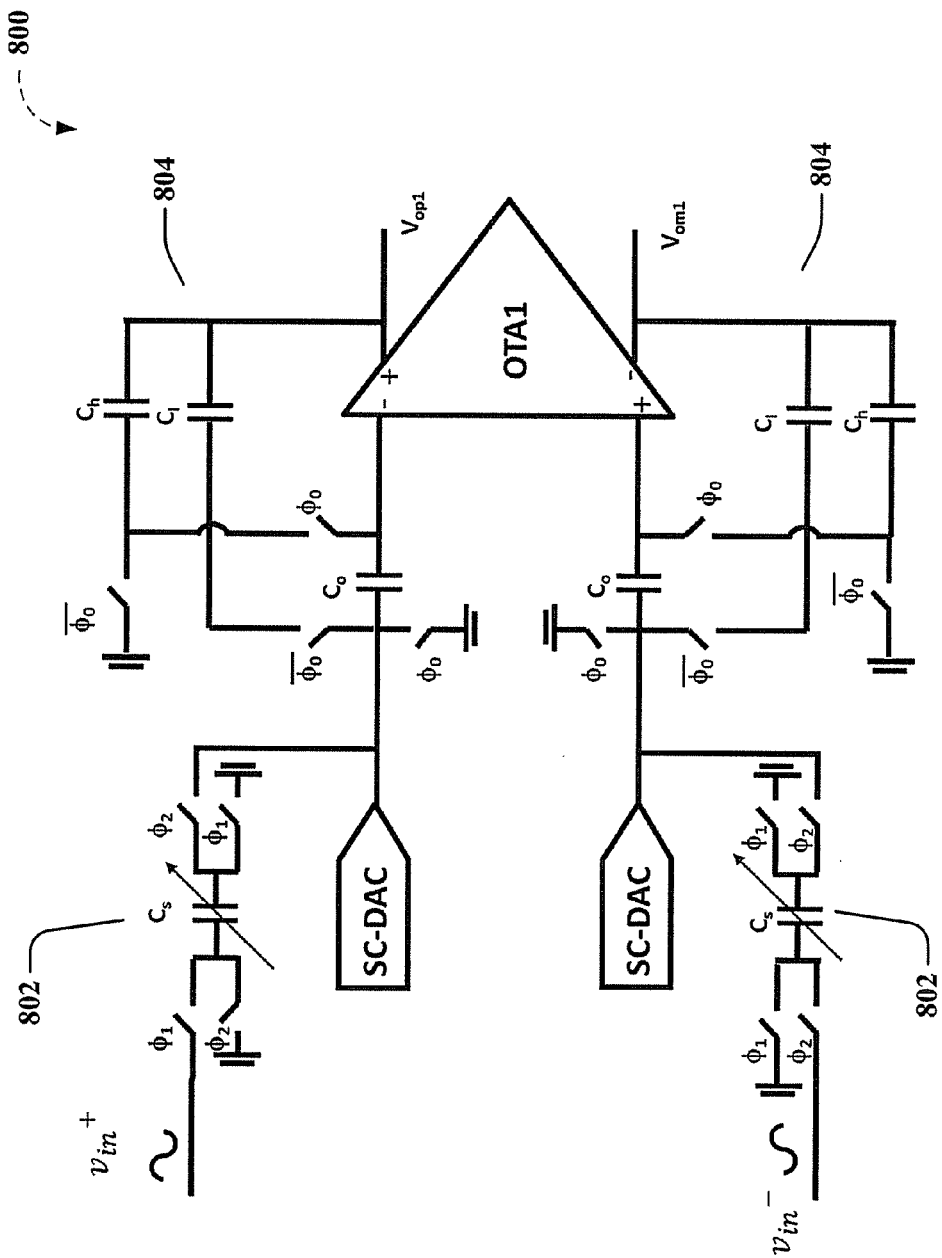
FIG. 8 depicts a schematic for an input stage of an exemplary discrete-time modulator with adjustable gain and correlated double-sampling suitable for use in various non-limiting embodiments of the subject disclosure.

As a further non-limiting example, FIG. 8 depicts a schematic for an input stage of an exemplary discrete-time modulator 800 with adjustable gain and correlated double-sampling suitable for use in various non-limiting embodiments of the subject disclosure. For instance, exemplary discrete-time modulator 800 with adjustable gain and correlated double-sampling can comprise an input stage of a discrete-time sigma-delta modulator that uses segmented capacitors 802 for AGC along with a correlated double-sampling mechanism 804 for DC offset compensation. As such, the input capacitor ($C_s$) 802 is sub-divided into, for example, eight unit capacitors thus, providing rational gain numbers of 1/8, 2/8, . . . , 1. In a further non-limiting aspect, correlated double-sampling can be performed at a rate below 20 Hz, which is well below the clock frequency of exemplary ADC 106 to avoid quantization noise folding.

Figure 9:
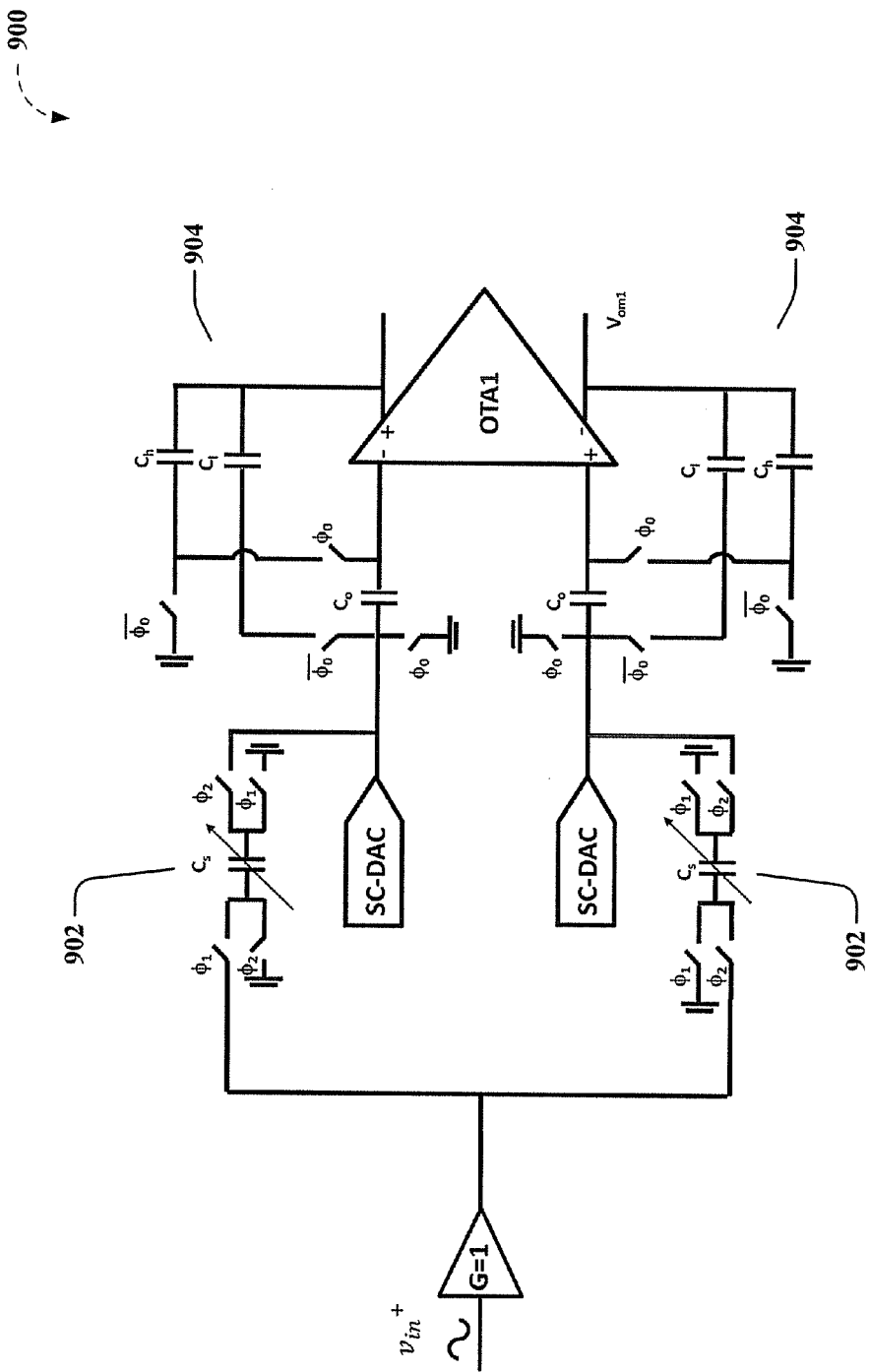
FIG. 9 depicts a schematic for an input stage of an exemplary discrete-time modulator with adjustable, correlated double-sampling and voltage doubling suitable for use in various non-limiting embodiments of the subject disclosure.

In yet another non-limiting example, FIG. 9 depicts a schematic for an input stage of an exemplary discrete-time modulator 900 with adjustable, correlated double-sampling and voltage doubling suitable for use in various non-limiting embodiments of the subject disclosure. In yet another embodiment, the input stage of exemplary discrete-time modulator 900 can employ segmented capacitors 902 for AGC along with a correlated double-sampling mechanism for DC offset compensation, wherein exemplary voltage doubling can facilitate providing single-ended to differential conversion, while effectively improving the signal-to-noise ratio of exemplary discrete-time modulator 900. In further non-limiting aspects, one or more of the analog stage components may use various techniques for DC offset removal or compensation, such as chopping and auto-zeroing.

Figure 10:
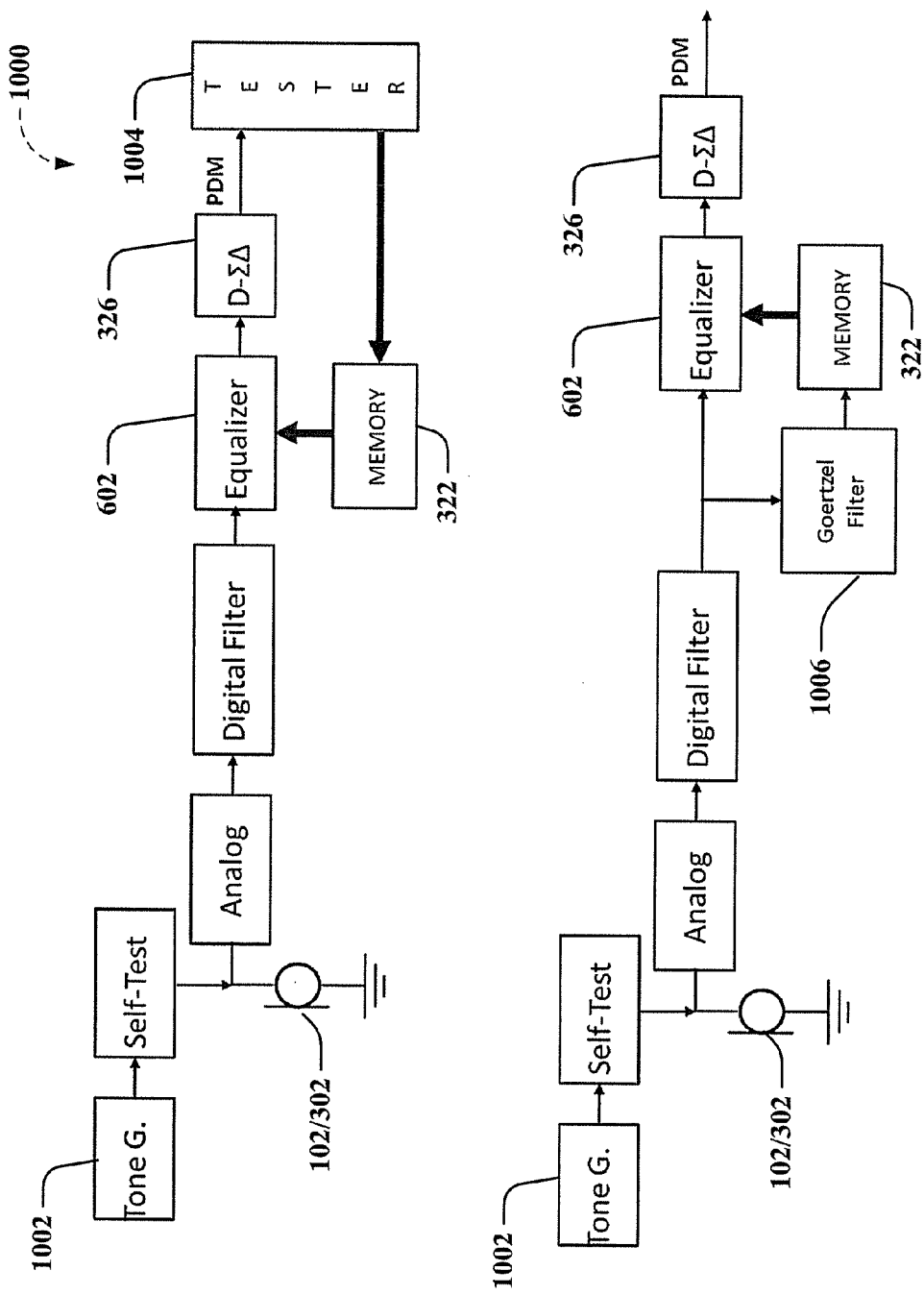
FIG. 10 depicts a functional block diagram of an exemplary embodiment that facilitates frequency response characterization of other non-limiting embodiments of the subject disclosure.

FIG. 10 depicts a functional block diagram of an exemplary embodiment that facilitates frequency response characterization of other non-limiting embodiments of the subject disclosure. As described above regarding FIGS. 5-6, for example, various non-limiting embodiments as described herein can employ equalization of the frequency response of microphone systems or devices comprising exemplary MEMS acoustic sensor 102/302, etc., and can adjust the frequency response of such microphone systems or devices to improve its overall signal-to-noise ratio. Conventional frequency equalization is typically performed on a separate device such as CODEC configured to receive the microphone system or device output. However, CODECs and microphones are generally fabricated by different companies with the result that any arbitrary microphone can be paired up with any selected CODEC in a device or system platform like a portable device. It can be understood that performing frequency equalization on the microphone device or system comprising exemplary MEMS acoustic sensor 102/302, etc. can have advantages, such as immediate access to the characteristics of the microphone device or system comprising exemplary MEMS acoustic sensor 102/302, etc. Similarly, linearity compensation of the microphone device or system comprising exemplary MEMS acoustic sensor 102/302, etc. can be performed more efficiently if it is done locally on the microphone device or system comprising exemplary MEMS acoustic sensor 102/302, etc.

Accordingly, FIG. 10 depicts approaches for obtaining the frequency response of a PDM microphone, as a non-limiting example. For instance, exemplary MEMS acoustic sensor 102/302, and associated microphone systems and devices as described herein, can facilitate factory calibration by employing a tone-generator 1002 having a variable frequency along with a tester 1004, which can be performed at the end of the fabrication process to obtain the frequency characteristics of exemplary MEMS acoustic sensor 102/302, and associated microphone systems and devices. As a further non-limiting example, exemplary MEMS acoustic sensor 102/302, and associated microphone systems and devices, can facilitate using a built-in self-test technique in which a signal processing engine (e.g., a signal processing engine comprising a Goertzel filter 1006), for example, can be integrated with the exemplary MEMS acoustic sensor 102/302, and/or associated microphone systems and devices, on the same die to facilitate determining the frequency response of the exemplary MEMS acoustic sensor 102/302, and associated microphone systems and devices. According to further non-limiting aspect, frequency response data can be stored in a non-volatile memory and/or volatile memory 322 (e.g., Memory NVM+SRAM 322) associated with the exemplary MEMS acoustic sensor 102/302, and associated microphone systems and devices, and can be employed by the frequency equalizer.

Figure 11:
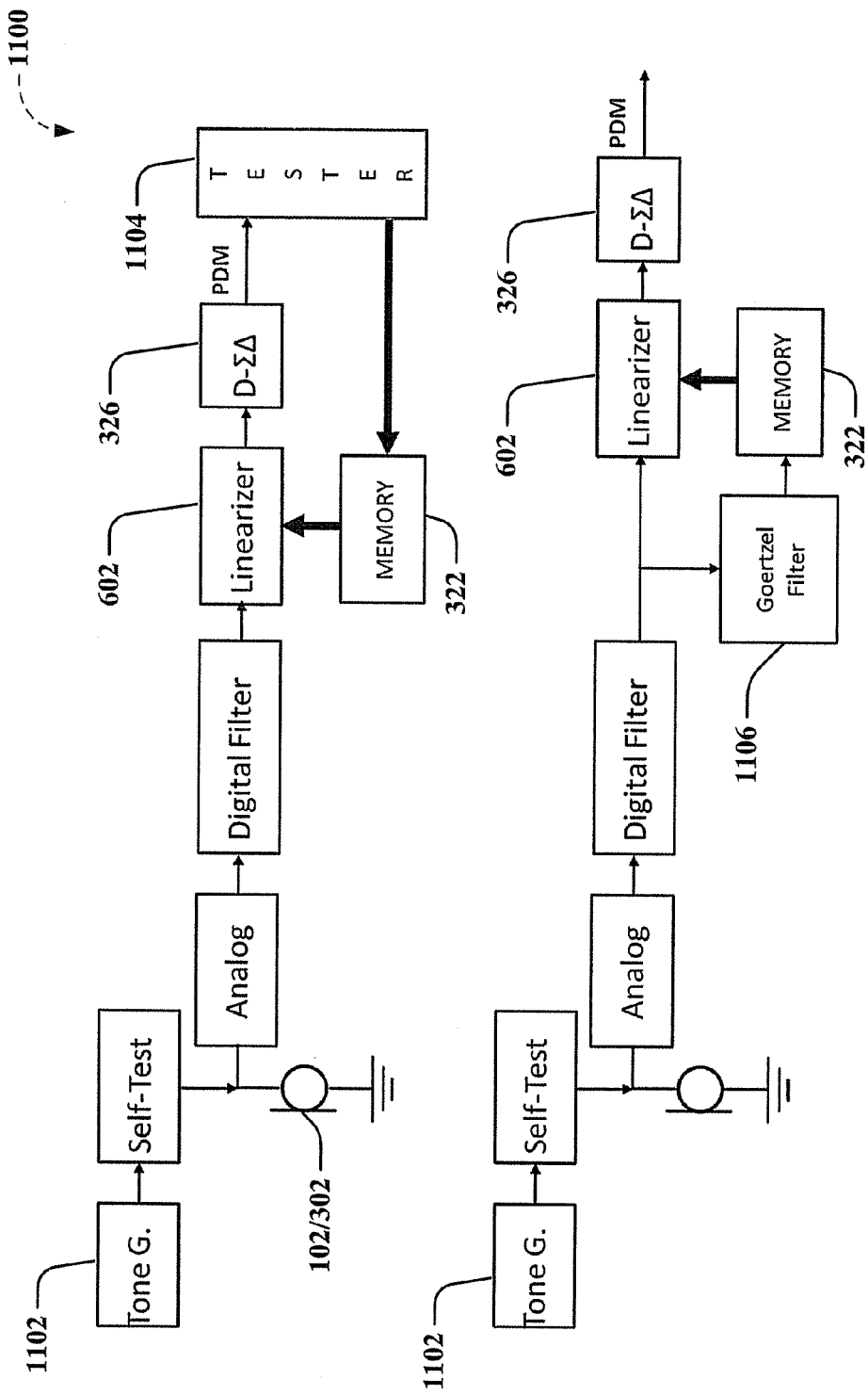
FIG. 11 depicts a functional block diagram of an exemplary embodiment to facilitate linearity characterization of other non-limiting embodiments of the subject disclosure.

Similarly, FIG. 11 depicts a functional block diagram of an exemplary embodiment to facilitate linearity characterization of other non-limiting embodiments of the subject disclosure. Accordingly, FIG. 11 depicts approaches for obtaining the linearity characteristics of a PDM microphone, as a non-limiting example. For instance, exemplary MEMS acoustic sensor 102/302, and associated microphone systems and devices as described herein, can facilitate factory calibration by employing a one-generator 1102 along with a tester 1104, which can be performed at the end of the fabrication process to obtain the linearity characteristics of exemplary MEMS acoustic sensor 102/302, and associated microphone systems and devices. As a further non-limiting example, exemplary MEMS acoustic sensor 102/302, and associated microphone systems and devices, can facilitate using a built-in self-test technique in which a signal processing engine (e.g., a signal processing engine comprising a Goertzel filter 1106), for example, can be integrated with the exemplary MEMS acoustic sensor 102/302, and/or associated microphone systems and devices, on the same die to facilitate determining the linearity characteristics of the exemplary MEMS acoustic sensor 102/302, and associated microphone systems and devices. According to further non-limiting aspect, linearity characteristic data can be stored in a non-volatile memory and/or volatile memory 322 (e.g., Memory NVM+SRAM 322) associated with the exemplary MEMS acoustic sensor 102/302, and associated microphone systems and devices, and can be employed by the linearizer. In a further non-limiting aspect, similar methods and/or embodiment can be employed to measure the gain of exemplary MEMS acoustic sensor 102/302, and associated microphone systems and devices, and to store the results in a non-volatile memory and/or volatile memory 322 (e.g., Memory NVM+SRAM 322) associated with exemplary MEMS acoustic sensor 102/302, and associated microphone systems and devices, for later use by the gain adjustment component 606.

Accordingly, various non-limiting embodiments of the subject disclosure can comprise an exemplary digital microphone device (e.g., exemplary digital microphone device 300/600 comprising exemplary MEMS acoustic sensor 102/302, etc.). In a non-limiting aspect, exemplary digital microphone device (e.g., exemplary digital microphone device 300/600 comprising exemplary MEMS acoustic sensor 102/302, etc.) can comprise MEMS acoustic sensor (e.g., exemplary MEMS acoustic sensor 102/302) configured to receive an acoustic signal, an amplifier (e.g., exemplary amplifier 104/304, etc.) configured to receive a signal the MEMS acoustic sensor (e.g., exemplary MEMS acoustic sensor 102/302) to create an amplified signal, and an ADC (e.g., ADC 106, ADC 106 comprising an exemplary analog sigma-delta modulator 202, exemplary continuous-time sigma-delta modulator 700, exemplary discrete-time modulator 800, exemplary discrete-time modulator 900, etc.) that converts the amplified signal into a digital signal. In further non-limiting embodiments of the subject disclosure, an exemplary digital microphone device (e.g., exemplary digital microphone device 300/600 comprising exemplary MEMS acoustic sensor 102/302, etc.) can further comprise an AGC component (e.g., AGC component 110/310, etc.) configured for automatic gain control of one or more of an analog gain stage or a digital gain stage associated with the MEMS acoustic sensor (e.g., exemplary MEMS acoustic sensor 102/302). In addition, exemplary digital microphone device (e.g., exemplary digital microphone device 300/600 comprising exemplary MEMS acoustic sensor 102/302, etc.) can further comprise a DC offset cancellation component (e.g., exemplary component DC offset compensation/cancellation component 112/312, etc.) configured to compensate for one or more adjustment of the one or more analog gain stage or the digital gain stage determined by the AGC component (e.g., AGC component 110/310, etc.).

In a further non-limiting aspect, exemplary digital microphone device (e.g., exemplary digital microphone device 300/600 comprising exemplary MEMS acoustic sensor 102/302, etc.), can be configured such that the one or more adjustment of the one or more analog gain stage or the digital gain stage is configured to be dynamically applied based on a characteristic of the acoustic signal to facilitate a high dynamic range associated with the digital microphone device (e.g., exemplary digital microphone device 300/600 comprising exemplary MEMS acoustic sensor 102/302, etc.). In yet another non-limiting aspect, exemplary digital microphone device (e.g., exemplary digital microphone device 300/600 comprising exemplary MEMS acoustic sensor 102/302, etc.), can be configured such that the one or more adjustment of the one or more analog gain stage or the digital gain stage can be applied below audible range for humans (e.g., about 20 Hz). In still another non-limiting aspect, exemplary digital microphone device (e.g., exemplary digital microphone device 300/600 the one or more adjustment of the one or more analog gain stage can be applied in an increment of a rational number of the form $k/2^N$, where k and N are integer numbers. In addition, exemplary digital microphone device (e.g., exemplary digital microphone device 300/600 comprising exemplary MEMS acoustic sensor 102/302, etc.) can further comprise AGC component (e.g., AGC component 110/310, etc.) comprising one or more of a set of unit resistors or a set of unit capacitors configured to facilitate applying the one or more adjustment of the analog gain stage, according to further non-limiting aspect.

As described above, exemplary digital microphone device (e.g., exemplary digital microphone device 300/600 comprising exemplary MEMS acoustic sensor 102/302, etc.) can further comprise a memory (e.g., a non-volatile memory and/or volatile memory 322) configured to store information associated with one or more of the AGC component (e.g., AGC component 110/310, etc.), frequency equalization (e.g., associated with exemplary digital frequency equalizer component 602), or non-linearity compensation (e.g., associated with exemplary digital linearizer component 604). Additionally, exemplary digital microphone device (e.g., exemplary digital microphone device 300/600 comprising exemplary MEMS acoustic sensor 102/302, etc.) can further comprise a passive attenuator (e.g., exemplary passive attenuator 316) configured to receive the signal from the MEMS acoustic sensor (e.g., comprising exemplary MEMS acoustic sensor 102/302, etc.) and to provide an attenuated signal to the amplifier (e.g., exemplary amplifier 104/304, etc.). As a non-limiting example, exemplary passive attenuator 316 can comprise a capacitive divider.

In addition, exemplary digital microphone device (e.g., exemplary digital microphone device 300/600 comprising exemplary MEMS acoustic sensor 102/302, etc.) Can be further comprise an exemplary AGC component (e.g., AGC component 110/310, etc.) further configured to apply the one or more adjustment of the one or more analog gain stage or the digital gain stage comprising a digital gain adjustment substantially equal (e.g., apply a compensating amount of digital gain via gain compensation component 108, etc.) to an analog attenuation, according to further non-limiting aspects. In various non-limiting implementations, exemplary digital microphone device (e.g., exemplary digital microphone device 300/600 comprising exemplary MEMS acoustic sensor 102/302, etc.) can further comprise a PDM signal generator (e.g., exemplary digital sigma-delta modulator 326) adapted to be configured dynamically based in part on the one or more adjustment of one or more analog gain stage or the digital gain stage determined by the AGC component (e.g., AGC component 110/310, etc.). As a non-limiting example, the order of an exemplary PDM signal generator (e.g., exemplary digital sigma-delta modulator 326) can be changed dynamically based in part on the one or more adjustment. As a non-limiting example, for an acoustic signal level that is low, order of an exemplary PDM signal generator (e.g., exemplary digital sigma-delta modulator 326) can be increased to 5 to facilitate improving its noise performance, whereas, as the acoustic signal level increases, order of an exemplary PDM signal generator (e.g., exemplary digital sigma-delta modulator 326) can be reduced to 4 to ensure its stability.

In further non-limiting implementations, exemplary digital microphone device (e.g., exemplary digital microphone device 300/600 comprising exemplary MEMS acoustic sensor 102/302, etc.) can further comprise a digital frequency equalizer component (e.g., exemplary digital frequency equalizer component 602) configured to compensate for distortion in the frequency response of the MEMS acoustic sensor (e.g., exemplary MEMS acoustic sensor 102/302, etc.). In a further non-limiting aspect, exemplary digital microphone device (e.g., exemplary digital microphone device 300/600 comprising exemplary MEMS acoustic sensor 102/302, etc.) can further comprise a digital linearizer component (e.g., exemplary digital linearizer component 604) configured to compensate for non-linearity of one or more of the MEMS acoustic sensor (e.g., exemplary MEMS acoustic sensor 102/302, etc.) or the analog gain stage, or components thereof, as described above. Thus, exemplary digital microphone device (e.g., exemplary digital microphone device 300/600 comprising exemplary MEMS acoustic sensor 102/302, etc.) can further comprise one or more of a frequency response characterization self-test component, as described above regarding FIG. 10, or a non-linearity characterization self-test component, as described above regarding FIG. 11.

In further non-limiting embodiments, the subject disclosure provides exemplary systems comprising a digital MEMS microphone (e.g., exemplary digital microphone device 300/600 comprising exemplary MEMS acoustic sensor 102/302, etc.) comprising an AGC component (e.g., AGC component 110/310, etc.) configured for automatic gain control of one or more of an analog gain stage or a digital gain stage associated with the digital MEMS microphone and a DC offset cancellation component (e.g., exemplary component DC offset compensation/cancellation component 112/312, etc.) configured to compensate for one or more adjustment of the one or more analog gain stage or the digital gain stage determined by the AGC component (e.g., AGC component 110/310, etc.).

In addition, exemplary systems comprising a digital MEMS microphone (e.g., exemplary digital microphone device 300/600 comprising exemplary MEMS acoustic sensor 102/302, etc.) can further comprise one or more of a digital frequency equalizer component (e.g., exemplary digital frequency equalizer component 602) configured to compensate for distortion in the frequency response of the digital MEMS microphone or a digital linearizer component (e.g., exemplary digital linearizer component 604) configured to compensate for non-linearity of one or more of a MEMS transducer (e.g., exemplary MEMS acoustic sensor 102/302, etc.) associated with the digital MEMS microphone or the analog gain stage, or components thereof. As further described above, exemplary systems comprising a digital MEMS microphone (e.g., exemplary digital microphone device 300/600 comprising exemplary MEMS acoustic sensor 102/302, etc.) can further comprise a memory (e.g., a non-volatile memory and/or volatile memory 322) configured to store information associated with one or more of the AGC component (e.g., AGC component 110/310, etc.), frequency equalization (e.g., associated with exemplary digital frequency equalizer component 602), or non-linearity compensation (e.g., associated with exemplary digital linearizer component 604) to facilitate operation of the digital MEMS microphone.

In still further non-limiting embodiments, exemplary systems comprising a digital MEMS microphone (e.g., exemplary digital microphone device 300/600 comprising exemplary MEMS acoustic sensor 102/302, etc.) can further comprise an output component (e.g., output component 114 comprising one or more of digital sigma-delta modulator 326, interpolation filter 608, circuitry for I²S signal generation 328, circuitry for SoundWire signal generation 330, and/or Input/Output (I/O) component 332, etc.) configured to transmit a digital signal associated with the digital MEMS microphone comprising one or more of a PDM signal, an I²S signal, or a Soundwire signal. In addition, exemplary systems (e.g., exemplary digital microphone device 300/600 comprising exemplary MEMS acoustic sensor 102/302, etc.) can further comprise embedded self-test circuitry configured to determine and store information associated with one or more of frequency equalization or nonlinearity compensation, according to further non-limiting aspects, as further described above regarding FIGS. 10-11.

In a further non-limiting aspect, exemplary systems (e.g., exemplary digital microphone device 300/600 comprising exemplary MEMS acoustic sensor 102/302, etc.) can further comprise a PDM signal generator (e.g., exemplary digital sigma-delta modulator 326) configured dynamically based in part on the one or more adjustment of the one or more analog gain stage or the digital gain stage determined by the AGC component (e.g., AGC component 110/310, etc.). In addition, exemplary system (e.g., exemplary digital microphone device 300/600 comprising exemplary MEMS acoustic sensor 102/302, etc.) can be further configured such that the one or more adjustment of the one or more analog gain stage or the digital gain stage is configured to be applied below audible range for humans (e.g., about 20 Hz).

Figure 12:
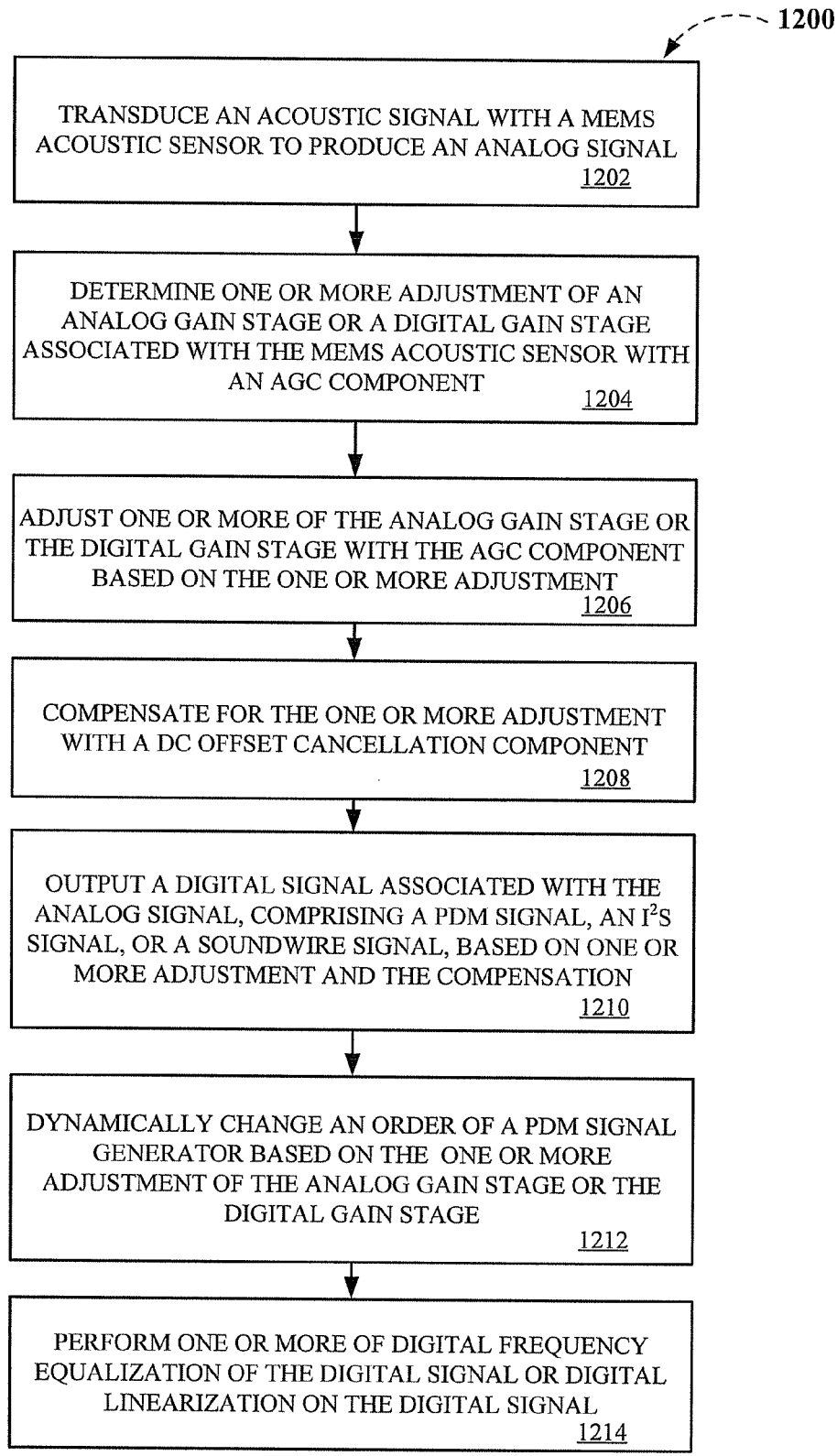
FIG. 12 depicts an exemplary flowchart of non-limiting methods associated with a various non-limiting embodiments of the subject disclosure.

In view of the subject matter described supra, methods that can be implemented in accordance with the subject disclosure will be better appreciated with reference to the flowcharts of FIG. 12. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

FIG. 12 depicts an exemplary flowchart of non-limiting methods 1200 associated with a various non-limiting embodiments of the subject disclosure. For instance, exemplary methods 1200 can comprise, at 1202, transducing an acoustic signal with a MEMS acoustic sensor (e.g., exemplary MEMS acoustic sensor 102/302, etc.) to produce an analog signal. In addition, exemplary methods 1200 can further comprise, at 1204, determining one or more adjustment of one or more of an analog gain stage or a digital gain stage associated with the MEMS acoustic sensor (e.g., exemplary MEMS acoustic sensor 102/302, etc.) with an AGC component (e.g., AGC component 110/310, etc.). In further non-limiting implementations, exemplary methods 1200 can further comprise, at 1206, adjusting one or more of the analog gain stage or the digital gain stage associated with the MEMS acoustic sensor (e.g., exemplary MEMS acoustic sensor 102/302, etc.) with the AGC component (e.g., AGC component 110/310, etc.) based at least in part on the one or more adjustment. as a non-limiting example, exemplary methods 1200 can further comprise, at 1206, adjusting one or more of the analog gain stage or the digital gain stage associated with the MEMS acoustic sensor (e.g., exemplary MEMS acoustic sensor 102/302, etc.) with the AGC component (e.g., AGC component 110/310, etc.) at a rate below audible range for humans (e.g., about 20 Hz).

In addition, exemplary methods 1200 can further comprise, at 1208, compensating for the one or more adjustment with a DC offset cancellation component (e.g., exemplary component DC offset compensation/cancellation component 112/312, etc.) configured for compensation of the one or more adjustment of the one or more analog gain stage or the digital gain stage determined by the AGC component (e.g., AGC component 110/310, etc.). In a non-limiting aspect, exemplary methods 1200 can further comprise, at 1210, outputting a digital signal associated with the analog signal, comprising one or more of a PDM signal, I²S signal, or a Soundwire signal, based at least in part on the one or more adjustment and the compensation. In other non-limiting embodiments, exemplary methods 1200 can further comprise, at 1212, dynamically changing an order of a PDM signal generator (e.g., exemplary digital sigma-delta modulator 326) associated with the digital signal based in part on the one or more adjustment of the one or more analog gain stage or the digital gain stage determined by the AGC component (e.g., AGC component 110/310, etc.). Moreover, exemplary methods 1200 can further comprise, at 1214, performing one or more of digital frequency equalization (e.g., via exemplary digital frequency equalizer component 602) of the digital signal to compensate for distortion in the frequency response associated with the MEMS acoustic sensor (e.g., exemplary MEMS acoustic sensor 102/302, etc.) or digital linearization (e.g., via exemplary digital linearizer component 604) on the digital signal to compensate for non-linearity of at least one of the MEMS acoustic sensor (e.g., exemplary MEMS acoustic sensor 102/302, etc.) or the analog gain stage.

However, various exemplary implementations of exemplary methods 1200 as described can additionally, or alternatively, include other process steps associated with features or functionality of acoustic sensors, microphones, sensors or microphone packages, and so on, as further detailed herein, for example, regarding FIGS. 1-11.

What has been described above includes examples of the embodiments of the subject disclosure. It is, of course, not possible to describe every conceivable combination of configurations, components, and/or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in subject disclosure for illustrative purposes, various modifications are possible that are considered within the scope of such embodiments and examples, as those skilled in the relevant art can recognize.

As used in this application, the terms "component," "module," "device" and "system" are intended to refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A digital microphone device, comprising:
   a microelectromechanical systems (MEMS) acoustic sensor configured to receive an acoustic signal;
   an amplifier configured to receive a signal the MEMS acoustic sensor to create an amplified signal;
   an analog-to-digital converter (ADC) that converts the amplified signal into a digital signal;
   an automatic gain compensation (AGC) component configured for automatic gain control of at least one of an analog gain stage or a digital gain stage associated with the MEMS acoustic sensor; and
   a direct current (DC) offset cancellation component configured to compensate for at least one adjustment of the at least one of the analog gain stage or the digital gain stage determined by the AGC component.

2. The digital microphone device of claim 1, wherein the at least one adjustment of the at least one of the analog gain stage or the digital gain stage is configured to be dynamically applied based on a characteristic of the acoustic signal to facilitate a high dynamic range associated with the digital microphone device.

3. The digital microphone device claim 1, wherein the at least one adjustment of the at least one of the analog gain stage or the digital gain stage is configured to be applied below audible range for humans.

4. The digital microphone device of claim 1, wherein the at least one adjustment of the at least one of the analog gain stage is configured to be applied in an increment of a rational number of the form $k/2^N$, where k and N are integer numbers.

5. The digital microphone device of claim 1, wherein the AGC component further comprises at least one of a set of unit resistors or a set of unit capacitors configured to facilitate applying the at least one adjustment of the at least one of the analog gain stage.

6. The digital microphone device of claim 1, further comprising:
   a passive attenuator configured to receive the signal from the MEMS acoustic sensor and to provide an attenuated signal to the amplifier.

7. The digital microphone device of claim 6, wherein the passive attenuator comprises a capacitive divider.

8. The digital microphone device of claim 1, wherein the AGC component is further configured to apply the at least one adjustment of the at least one of the analog gain stage or the digital gain stage comprising a digital gain adjustment substantially equal to an analog attenuation.

9. The digital microphone device of claim 1, further comprising:
   a pulse-density modulation (PDM) signal generator adapted to be configured dynamically based in part on the at least one adjustment of the at least one of the analog gain stage or the digital gain stage determined by the AGC component.

10. The digital microphone device of claim 9, wherein an order of the PDM signal generator is changed dynamically based in part on the at least one adjustment.

11. The digital microphone device of claim 1, further comprising:
    a digital frequency equalizer component configured to compensate for distortion in the frequency response of the MEMS acoustic sensor.

12. The digital microphone device of claim 11, further comprising:
    a frequency response characterization self-test component.

13. The digital microphone device of claim 1, further comprising:
    a digital linearizer component configured to compensate for non-linearity of at least one of the MEMS acoustic sensor or the analog gain stage.

14. The digital microphone device of claim 13, further comprising:
a non-linearity characterization self-test component.

15. The digital microphone device of claim 1, further comprising;
a memory configured to store information associated with at least one of the AGC component, frequency equalization, or non-linearity compensation.

16. A system, comprising:
a digital microelectromechanical systems (MEMS) microphone comprising an automatic gain compensation (AGC) component configured for automatic gain control of at least one of an analog gain stage or a digital gain stage associated with the digital MEMS microphone and a direct current (DC) offset cancellation component configured to compensate for at least one adjustment of the at least one of the analog gain stage or the digital gain stage determined by the AGC component;
at least one of a digital frequency equalizer component configured to compensate for distortion in the frequency response of the digital MEMS microphone or a digital linearizer component configured to compensate for non-linearity of at least one of a MEMS transducer associated with the digital MEMS microphone or the analog gain stage;
a memory configured to store information associated with at least one of the AGC component, frequency equalization, or non-linearity compensation to facilitate operation of the digital MEMS microphone; and
an output component configured to transmit a digital signal associated with the digital MEMS microphone comprising at least one of a pulse-density modulation (PDM) signal, integrated interchip sound (I2S) signal, or a Soundwire signal.

17. The system of claim 16, further comprising:
embedded self-test circuitry configured to determine and store information associated with at least one of frequency equalization or nonlinearity compensation.

18. The system of claim 16, further comprising:
a pulse-density modulation (PDM) signal generator configured dynamically based in part on the at least one adjustment of the at least one of the analog gain stage or the digital gain stage determined by the AGC component.

19. The system of claim 16, wherein the at least one adjustment of the at least one of the analog gain stage or the digital gain stage is configured to be applied below audible range for humans.

20. A method, comprising:
transducing an acoustic signal with a microelectromechanical systems (MEMS) acoustic sensor to produce an analog signal;
determining at least one adjustment of at least one of an analog gain stage or a digital gain stage associated with the MEMS acoustic sensor with an automatic gain compensation (AGC) component;
adjusting at least one of the analog gain stage or the digital gain stage associated with the MEMS acoustic sensor with the AGC component based at least in part on the at least one adjustment;
compensating for the at least one adjustment with a direct current (DC) offset cancellation component configured for compensation of the at least one adjustment of the at least one of the analog gain stage or the digital gain stage determined by the AGC component; and
outputting a digital signal associated with the analog signal, comprising at least one of a pulse-density modulation (PDM) signal, integrated interchip sound (I2S) signal, or a Soundwire signal, based at least in part on the at least one adjustment and the compensation.

21. The method of claim 20, wherein the adjusting comprises adjusting at a rate below audible range for humans.

22. The method of claim 20, further comprising:
dynamically changing an order of a PDM signal generator associated with the digital signal based in part on the at least one adjustment of the at least one of the analog gain stage or the digital gain stage determined by the AGC component.

23. The method of claim 20, further comprising:
performing at least one of digital frequency equalization of the digital signal to compensate for distortion in the frequency response associated with the MEMS acoustic sensor or digital linearization on the digital signal to compensate for non-linearity of at least one of the MEMS acoustic sensor or the analog gain stage.

* * * * *